United States Patent
Yamazaki et al.

(10) Patent No.: US 6,653,701 B1
(45) Date of Patent: Nov. 25, 2003

(54) SEMICONDUCTOR DEVICE AND PRODUCTION METHOD THEREOF

(75) Inventors: Yoshihisa Yamazaki, Minamiashigara (JP); Yoshiyuki Ono, Minamiashigara (JP); Hokuto Takada, Minamiashigara (JP); Katsuhiro Sato, Minamiashigara (JP); Akira Imai, Minamiashigara (JP); Hidekazu Hirose, Minaminashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/520,441

(22) Filed: Mar. 7, 2000

(30) Foreign Application Priority Data

| Mar. 9, 1999 | (JP) | 11-061682 |
| Sep. 14, 1999 | (JP) | 11-260660 |
| Feb. 15, 2000 | (JP) | 2000-036815 |

(51) Int. Cl.$^7$ ................................. H01L 51/20
(52) U.S. Cl. ................. 257/414; 438/48; 438/65; 438/77; 438/82; 438/85; 136/263; 136/248; 136/252; 257/431
(58) Field of Search .............. 438/48–99; 136/263, 136/248, 255, 252, 260, 265; 257/40, 43, 431, 414

(56) References Cited

U.S. PATENT DOCUMENTS

| 3,791,863 A | * | 2/1974 | Quirk ................... 117/217 |
| 3,900,940 A | * | 8/1975 | Gebhard, Jr. ............ 29/420 |
| 4,353,957 A | * | 10/1982 | Rutt et al. ................ 428/292 |
| 4,412,377 A | * | 11/1983 | Nagashima et al. ....... 29/577 |
| 4,483,751 A | * | 11/1984 | Murayama et al. ....... 204/370.1 |
| 4,882,455 A | * | 11/1989 | Sato et al. ................ 174/68.5 |
| 5,246,782 A | * | 9/1993 | Kennedy et al. .......... 428/421 |
| 5,501,744 A | * | 3/1996 | Albright et al. ........... 136/258 |
| 5,686,172 A | * | 11/1997 | Ohya et al. ............... 428/210 |
| 5,910,336 A | * | 6/1999 | Ishihara et al. ........... 427/240 |
| 5,942,048 A | * | 8/1999 | Fujisaki et al. ........... 136/256 |
| 6,084,176 A | * | 7/2000 | Shiratsuchi et al. ....... 136/263 |
| 6,369,934 B1 | * | 4/2002 | Bechinger et al. ........ 359/265 |

FOREIGN PATENT DOCUMENTS

| JP | 61086256 A | * | 5/1986 | ........... B32B/9/00 |
| JP | 03241779 A | * | 10/1991 | ......... H01L/29/28 |
| JP | A-11-144772 | | 5/1999 | |

OTHER PUBLICATIONS

Y.Matsumoto, *Preparation of Functional Oxide Films*, Surface Technology, vol. 49, No. 1, 1998, pp. 3–6.

F. Goto et al, *A New Technique of Compound Semiconductor Deposition from an Aqueous Solution by Photochemical Reactions*, Jpn. J. Appln. Phys., vol. 36 (1997), pp. L1146–L1149.

S. Dhar et al., *Properties of Chemically Deposited $Cu_2S$ Films on Porous Silicon*, J. Appl. Phys, 82(2), Jul. 1997, pp. 655–657.

* cited by examiner

Primary Examiner—Matthew Smith
Assistant Examiner—Renzo N Rocchegiani
(74) Attorney, Agent, or Firm—Oliff & Berridge, PLC

(57) ABSTRACT

A semiconductor device having laminated successively a porous semiconductor layer, an inorganic semiconductor layer, and optionally an organic substance layer formed therebetween is disclosed. The semiconductor device is produced by immersing a porous semiconductor layer or a semiconductor layer having an organic substance layer on the surface thereof in a solution containing the elements constituting an inorganic semiconductor or compounds of the elements and forming the inorganic semiconductor layer on the porous semiconductor layer or the organic substance layer in the solution.

14 Claims, 6 Drawing Sheets

LIGHT

LIGHT

SEMICONDUCTOR DEVICE AND PRODUCTION METHOD THEREOF

FIELD OF THE INVENTION

The present invention relates to a semiconductor device and a production method thereof, and specifically to a semiconductor device suitable for use as a solar cell and to a production method thereof.

BACKGROUND OF THE INVENTION

Hitherto, a semiconductor device has been realized by an inorganic semiconductor such as an element-base semiconductor typified by silicon (Si), etc., a compound semiconductor typified by gallium arsenide (GaAs), etc., and an oxide semiconductor typified by zinc oxide (ZnO), etc. As a typical structure of a semiconductor device, a structure of using an electron or a positive hole as a majority carrier, that is, a so-called pn junction element has been used. Furthermore, a transistor, etc., using many pn junctions have been used for many products as semiconductor devices. An organic material has a merit of realizing by a molecular design the function typified by an organic photoreceptor mounted on a copying machine, a printer, etc., a sensitizer used for photographic films, etc., an organic electro luminescence material, an organic semiconductor, etc. Recently, with regard to an organic semiconductor, research and development of a pn junction, etc., have been carried out as is the case for an inorganic semiconductor, and an effort to the commercialization has been continued.

However, in an inorganic semiconductor, there are problems that in Si, GaAs, etc., in the production of the case of giving a function as a semiconductor device, not only the cost is greatly increased but also a very high technique is required, which is lacking in the simplicity. Furthermore, in a semiconductor device using an inorganic semiconductor only, not only the function of the device is limited by the characteristics of the selected inorganic semiconductor material but also when the device is not prepared in the form of sufficiently taking into consideration of the structural characteristics of the inorganic semiconductor material, such as matching of a lattice constant, etc., whereby causing the deterioration of the characteristics, etc. On the other hand, in the organic material, the cost of the material itself and the production cost of the semiconductor device are relatively low, and also the production of the device is simple. However, it cannot be said that the quality of the organic material is practical in regard to the electrical characteristics such as, mainly, the resistance and the mobility necessary for making function as a semiconductor device. Thus, by combining an inorganic semiconductor and the organic material, the excellent points of both materials in the costs, the simplicity of the production, and the characteristics are utilized, and by giving a specific characteristic to one or both of the inorganic semiconductor and the organic material, the above-described problems can be solved and such a combination can be used as a new element.

SUMMARY OF THE INVENTION

The present invention has been made from the above-described viewpoint and provides a semiconductor device excellent in the simplicity of the production and the functional characteristics at a low cost.

As the result of various investigations, the present inventors have found that the above-described problems on the semiconductor device and the production method thereof can be solved by employing a specific material and a specific structure.

This invention provides a semiconductor device, wherein a porous semiconductor layer and an inorganic semiconductor layer are laminated in this order.

The porous semiconductor layer may contains a metal oxide or a compound semiconductor.

The semiconductor device may be used as a solar cell.

An organic substance layer may additionally be formed between a porous semiconductor layer and an inorganic semiconductor.

The organic substance layer may be a monomolecular film of a sensitizing dye.

The porous semiconductor may be titanium oxide or indium copper sulfide.

This invention also provides a method of producing a semiconductor device, wherein a porous semiconductor layer or a semiconductor layer having an organic substance layer on the surface thereof is immersed in a solution containing elements constituting an inorganic semiconductor or compounds containing the constituting elements, and an inorganic semiconductor layer is formed onto the porous semiconductor layer or the organic substance layer in the solution.

BRIEF DESCRIPTION OF THE DRAWINGS

Preferred embodiments of a semiconductive device according to the present invention will be described in detail based on the drawings.

DETAILED DESCRIPTION OF THE INVENTION

Figure 1:
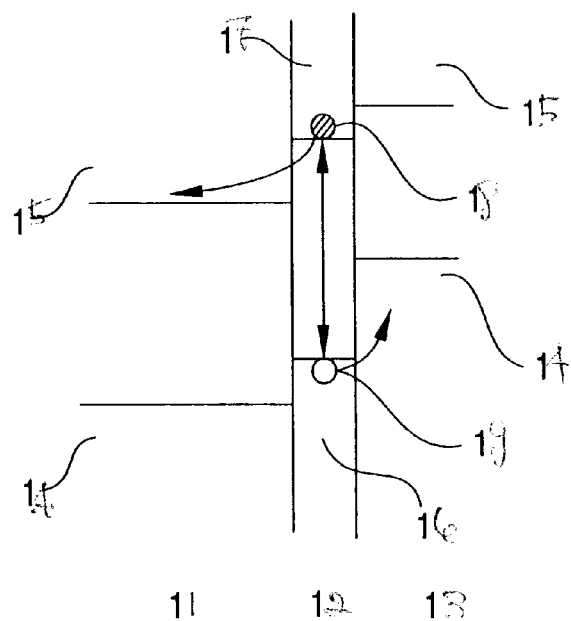
FIG. 1 is an energy band view of the construction having an organic substance layer or an organic monomolecular layer between two inorganic semiconductors.

Then, the embodiments of the invention are described in detail by referring to the examples shown in the accompanying figures.

The semiconductor device of the invention is (1) a semiconductor device wherein a porous semiconductor layer and an inorganic semiconductor are laminated in this order , (2) a semiconductor device having an organic substance layer between a porous semiconductor layer and an inorganic semiconductor, or (3) a semiconductor device having an organic monomolecular layer between two inorganic semiconductor layers.

The inorganic semiconductor in these semiconductor devices may be a single element semiconductor of group IV of the so-called elemental periodic table, such as silicon (Si), etc., known at present or a so-called compound semiconductor of gallium arsenide (GaAs), etc., and also a metal oxide having a property of semiconductor, typified by titanium oxide. There is no particular restriction on the form of the inorganic semiconductor and the form may be a single crystal, a polycrysltal, an amorphous form or a mixed form thereof. Furthermore, for improving the electric conductivity, the inorganic semiconductor may contain an impurity as a dopant. Also, there are no particular restrictions on the form, the structure, the size, etc., of the semiconductor electrode and they can be properly selected according to the purposes.

The organic substance layer in the invention may be a film constituted of a hydrocarbon compound particularly having functions (for example, light emitting and a charge generation by an external excitation, etc.) by itself and particularly, may be a layer capable of forming an organic monomolecular layer, and can be properly selected from known organic monomolecules. The organic monomolecular layer has the functions of a charge-generating material or a fluorescent material, etc., as the organic substance layer described above, but is not limited to the materials and the functions described above.

For the organic monomolecular layer material, the charge-generating material includes metal complexes of Ru, etc., organic pigments and dyes such as azoic pigments, quinone-base pigments, perylene-base pigments, indigo-base pigments, thioindigo-base pigments, bisbenzimidazole-base pigments, phthalocyanine-base pigments, quinacridone-base pigments, quinoline-base pigments, lake-base pigments, azolake-base pigments, anthraquinone-base pigments, oxazine-base pigments, dioxazine-base pigments, triphenylmethane-base pigments, azulenium-base dyes, squaleum-base dyes, pyrylium-base dyes, triallylmethane-base dyes, xanthene-base dyes, thiazine-base dyes, cyanine-base dyes, etc., and further fused-ring aromatic pigments, perylene-base pigments, and azoic pigments are preferred from the viewpoints of the sensitivity, the electric stability, and the photochemical stability to an irradiated light. The pigments and dyes described above may be singly or as a mixture of two or more kinds thereof.

The fluorescent material includes dye-added fluorescent materials added with a fluorescent dye for laminated structure or the fluorescent dye having added therein a dopant, such as electron transport fluorescent materials typified by an aluminum complex, hole transport fluorescent materials, amphoteric transport fluorescent materials, and particularly, the fluorescent material added with Crymarine 540, dicyanmethylenepyran-base dye, or a quinacridone derivative is preferred. As a matter of course, the organic monomolecular layer material is not limited to the charge-generating material and the fluorescent material.

Also, a method of adsorbing the organic monomolecule onto one of the inorganic semiconductor can be carried out by dissolving or dispersing a material constituting the organic monomolecule in a proper solvent and dipping the inorganic semiconductor in the solution or the dispersion. In addition, it can also be carried out by a method of evaporating the material constituting the organic monomolecule in vacuum and adsorbing the vapor in the vapor phase.

As a specific sticking method, a self organization method, etc., can be used. For example, it may be a Langmuir-Blodgett method (hereinafter, referred to as LB method) of spreading a molecule having a hydrophilic terminal group on a vapor phase-liquid phase (water) interface and accumulating the organic monomolecular layers in a state of minimizing the occupied area of the spread molecule. The sticking method may be a chemical adsorption method that in the LB method, to minimize the occupied area of the molecule, an end of the vapor phase-liquid phase (water) interface is pushed using a jig called barrier to reduce the occupied area of the molecule and to increase the density of the molecule, and forming the organic monomolecular layer on an inorganic semiconductor by utilizing the condensation reaction between a reactive group such as a hydroxyl group exposed on the surface of the inorganic semiconductor and a hydrolyzing functional group formed to the terminal of the adsorption molecule. Because by a chemical reaction of the molecule constituting the spread monomolecular layer (film) and the inorganic semiconductor, a chemical bond such as —Si—O—, —Ge—O—, —Ti—O—, etc., is formed, the inorganic semiconductor can have the organic monomolecular layer having a large mechanical strength and excellent in the heat resistance and the durability.

Also, in place of the above-described adsorption molecule having the hydrolyzing functional group, an adsorption molecule having a thiol group can be used and because in this case, by reacting the molecule constituting an organic monomolecular layer and the inorganic semiconductor, a covalent bond by —S— is formed, the inorganic semiconductor can have the organic monomolecular layer having a large mechanical strength and excellent in the heat resistance and the durability as the case of using the adsorption molecule of silane-base, germanium-base, titanate-base, etc. In these molecules, a silane-base compound is suitable from the viewpoints of facility of synthesis, the strength, and the kind. Also, the organic monomolecular layer can be formed on the inorganic semiconductor wherein the surfaces of fine particles, etc., are not smooth.

Also, in the above-described organic substance layer, at least two organic monomolecular layers may be accumulated, and such layers are formed by the above-described production method, etc.

The organic substance layer can be formed by dispersing functional organic materials such as the charge-generating material (e.g., a sensitizing dye) and the organic fluorescent material as an electroluminescence material in a binder resin dissolved in an organic solvent and coating the dispersion.

The binder resin includes polyvinyl acetal-base resins such as a polyvinyl butyral resin, a polyvinyl formal resin, a partial-acetal polyvinyl acetal resin modified with formal, acetoacetal, etc., and the like; polyamide-base resins, a polyester resin, a modified ether-type polyester resin, a polycarbonate resin, an acrylic resin, a polyvinyl chloride resin, a polyvinylidene chloride resin, a polystyrene resin, a polyvinyl acetate resin, a vinyl chloride-vinyl acetate copolymer, a silicone resin, a phenol resin, a phenoxy resin, a melamine resin, a benzoguanamine resin, a urea resin, a polyurethane resin, a poly-N-vinylcarbazole resin, a polyvinyl anthracene resin, polyvinylpyrene, etc. In these binder resins, in the case of using, particularly, a polyvinyl acetal-base resin, a vinyl chloride-vinyl acetate-base resin, a phenoxy resin, and a denatured ether-type polyester resin, a pigment is dispersed well, the pigment-dispersed coating liquid is stable for a long period of time without aggregating the pigment, and a uniform film is formed by using the coating liquid, which results in improving the electric characteristics and the performance. However, the binder resin is not limited to these resins and any resins which can form coating in an ordinary state can be used.

These binder resins can be used singly or as a mixture of two or more kinds thereof. The mixing ratio of the functional organic material to the binder resin is in the range of preferably from 5:1 to 1:2 by the accumulation ratio. The solvent used in the case of preparing the coating liquid includes organic solvents usually used, such as, methanol, ethanol, n-propanol, n-butanol, benzyl alcohol, methyl cellosolve, ethyl cellosolve, acetone, methyl ethyl ketone, cyclohexanone, chlorobenzene, methyl acetate, n-butyl acetate, dioxane, tetrahydrofuran, methylene chloride, chloroform, etc. The organic solvents may be used singly or as a mixture of two or more kinds thereof. It is proper that the thickness of the organic layer is from 0.01 to 5 μm, and preferably from 0.1 to 2.0 μm. When the thickness is less than 0.01 μm, it becomes difficult to uniformly form the functional organic material film, and when the thickness exceeds 5 μm, a trouble occurs at accumulating the 2nd semiconductor layer.

Also, a stabilizer such as an antioxidant, a deactivating agent, etc., can be added into the organic substance layer. Examples of the antioxidant include a phenol-base compound, a sulfur-base compound, a phosphorus-base compound, an amine-base compound, etc. Examples of the deactivating agent include bis(dithiobenzyl) nickel, nickel di-n-butylthiocarbamate, etc.

An undercoat can be formed between the organic substance layer and the inorganic semiconductor. As the binder resin used for the under layer, known materials such as a polyamide resin, a vinyl chloride resin, a vinyl acetate resin, a phenol resin, a polyurethane resin, a melamine resin, a benzoguanamine resin, a polyimide resin, a polyethylene resin, a polypropylene resin, a polycarbonate resin, an acrylic resin, a methacrylic resin, a vinylidene chloride resin, a polyvinyl acetal resin, a vinyl chloride-vinyl acetate copolymer, a polyvinyl alcohol resin, a water-soluble polyester resin, nitrocellulose, casein, gelatin, polyglutamic acid, starch, starch acetate, amino starch, polyacrylic acid, polyacrylamide, a zirconium chelate compound, a titanyl chelate compound, a titanyl alkoxide compound, an organic titanyl compound, a silane coupling agent, etc., can be used. Also, these materials can be used singly or as a mixture of two or more kinds of them. Furthermore, the binder resin can be mixed with the fine particles of titanium oxide, aluminum oxide, silicon oxide, zirconium oxide, barium titanate, a silicone resin, etc. As a coating method at forming the undercoat layer, an ordinary method such as a blade coating method, a wire bar coating method, a spray coating method, a dip coating method, a bead coating method, an air knife coating method, a curtain coating method, etc., can be used. It is proper that the thickness of the undercoat layer is from 0.01 to 10 μm, and preferably from 0.05 to 2 μm.

Also, there is no particular restriction on the form of the porous semiconductor and the form thereof may be, for example, an aggregate of fine particles or a grooved form capable of being formed by etching. By having the porous structure, the bonding area with the organic substance layer becomes large and thus the charge separation carried out near the interface can be greatly improved as compared with a semiconductor device of prior art.

The performance principles of the semiconductor devices (2) and (3) of the invention described above are explained by showing the energy band of the inorganic semiconductors (11 and 13) and the organic substance layer 12 of FIG. 1. For example, when a material generating a pair of an electron 18 and a hole 19 by the excitation from outside is used for the organic substance layer 12 or the organic monomolecular layer 12, by constituting one of the inorganic semiconductor layers with the inorganic semiconductor 11 having a conductive level 15 lower than the LUMO (lowest unoccupied molecular orbital) energy level 17 of the organic substance layer or the organic monomolecular layer 12 and the other of the inorganic semiconductor layers with the inorganic semiconductor 13 having a valence electron level 14 higher than the HOMO (Highest occupied molecular orbital) energy level 16, a semiconductor device having a photodiode function can be realized. Also, when the organic monomolecular material is a material generating light by the injection of an electron positive hole, it can be realized to impart the function of a light-emitting diode. The organic substance layer or the organic monomolecular material is different from an inorganic material and because the material design of obtaining a light-emitted color is simple as compared with an inorganic material design, various characteristics can be imparted to the semiconductor device of the invention. Also, when in the above-described explanation, the energetic design is made so that the separation of an electron position hole or bonding of an electron positive hole is carried out by the organic substance layer or the organic monomolecular layer, the invention is not limited to the above explanation.

The semiconductor device of the invention can be produced by depositing at least one of the above-described inorganic semiconductor layers on the organic substance layer or the organic monomolecular layer in a solution containing the elements constituting the inorganic semiconductor or containing the compound of the elements. By dopositing the inorganic semiconductor onto the organic substance layer or the organic monomolecular layer in the solution, a semiconductor device having a desired function can be realized without need of the treatment at a high temperature which is indispensable at the formation of the inorganic semiconductor and thus without destroying the organic substance layer or the organic monomolecular layer by heat.

In the deposition of the inorganic semiconductor layer onto the organic substance layer or the organic monomolecular layer of the semiconductor device of the invention, at least one of the inorganic semiconductors can form the inorganic semiconductor layer by a solution growing method using a solution containing the elements constituting the inorganic semiconductor or containing the compounds of the elements. The deposition onto the organic substance layer or the organic monomolecular layer in the solution containing the elements constituting the inorganic semiconductor or containing the compounds of the elements means a deopsition by an electrodeposition method, a chemical bath deposition method, etc., which are known techniques, but when the inorganic semiconductor layer can be formed on the organic substance layer or the organic monomolecular layer in the solution containing the elements constituting the inorganic semiconductor or containing the compounds of the elements without applying a high-temperature treatment as explained above, any deposition method may be used. The solution growing method employed in the invention is preferably the electrodeposition method.

In the electrodeposition method used in the invention, a substrate capable of passing electric current, which carries out the coat of a desired inorganic semiconductor, and a counter electrode are immersed in the solution containing at least the elements constituting the inorganic semiconductor or containing the compounds of the elements, and by passing an electric current between the substrate and the counter electrode in the solution, the inorganic semiconductor is accumulated.

Figure 2:
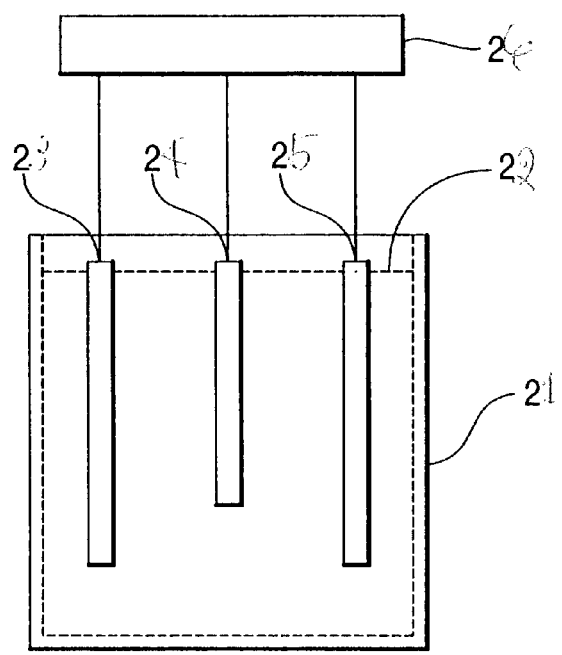
FIG. 2 is a side view of a general construction of an electrodeposition method.

FIG. 2 shows a construction necessary for carrying out a general electrodeposition method. In a bath 21 is filled a solution 22 containing the elements constituting a desired inorganic semiconductor or containing the compounds of the elements. The solution 22 may be, as a matter of course, an aqueous solution but a solvent in which the elements constituting the inorganic semiconductor or the compounds of the elements is dissolved can be used without any restriction. In the solution 22 are immersed a substrate 23 carrying a desired inorganic semiconductor, a reference electrode 24, and a counter electrode 25, the substrate 23 and the counter electrode 25 are connected to a potentiostat 26, a negative potential is applied to the substrate 23, a positive potential to the counter electrode 25, and a reference potential to the reference electrode 24. The substrate 23 has carried thereon a porous semiconductor layer, an inorganic semiconductor, and an organic monomolecular layer on the inorganic semiconductor; has carried an organic substance layer on a porous semiconductor layer; or has carried an organic monomolecular layer on a porous inorganic semiconductor in the invention. The reference potential is a potential for keeping the potential of the substrate 23 at a desired constant potential and as the standard reference electrode, SCE (saturated calomel electrode) or a silver-silver chloride electrode is used. The reference electrode 24 is used to change the potential of the substrate 23 to a desired potential. When an electrochemical reaction proceeds on the substrate 23, it sometimes happens that the potential is changed near the surface of the substrate 23. To control the above-described potential change, the potentiostat 26 changes the potential of the substrate 23 to a desired potential to the reference electrode 24. Also, because the electrochemical reaction proceeds during passing electric current in the solution, the resistance of the solution is changed and the passing electric current changes, but the potentiostat makes the electric current constant by controlling the voltage. The electrodeposition method described above is most suitable.

Furthermore, the semiconductor device of the invention is effective as a solar cell.

In the solar cell of the invention, the organic substance layer or the organic monomolecular layer is a so-called sensitizing dye organic substance, that is an organic substance generating an electron or a positive hole by an external light irradiation. The sensitizing dye may be one showing a photosensitizing action and can be properly selected from known dyes. Examples of the sensitizing dye include xanthene-base dyes such as Rhodamine B, Rose Bengal, Eosine, 4-carboxy-2',4',5',7'-tetraiodofluoresceine, erythrosine, etc.; cyanine-base dyes such as quinocyanine, cryptocyanine, etc.; basic dyes such as phenosafranine, thiosine, Methylene Blue, etc.; porphyrin-base compounds such as chlorophyll, zinc porphyrin, magnesium porphyrin, etc.; azo dyes; phthalocyanine compounds; complex compounds such as Ru trispyridyl, etc.; anthraquinone-base dyes; polycyclic quinone-base dyes, etc.

In the solar cell of the invention, at least one of the inorganic semiconductor layers is a metal oxide. It is desirable that the metal oxide is constituted by at least one of ZnO (zinc oxide), $SnO_2$ (tin oxide), $In_2O_3$ (indium oxide), $SnO_2$-$In_2O_3$ (solid solution of tin oxide and indium oxide, ITO), $TiO_2$ (titanium oxide), ZnO (zinc oxide), $Nb_2O_5$ (niobium oxide), $SrTiO_3$ (strontium titanium oxide), etc. In these metal oxides, it is more suitable that the metal oxide is titanium oxide. To control the carrier concentration, an impurity can be introduced or the above-described material having a changed composition ratio can be used.

Furthermore, in the solar cell of the invention, at least one of the inorganic semiconductor layers is a compound semiconductor. It is preferred that the compound semiconductor is constituted of the elements belonging to groups Ib, IIIb, and VIb of the periodic table. For example, it is preferred that the compound semiconductor constituted of the elements belonging to groups Ib, IIIb, and VIb of the periodic table is as least one compound semiconductor selected from $CuGaS_2$ (gallium copper sulfide). $CuGaSe_2$ (gallium copper selenide), $CuGaTe_2$ (gallium copper telluride), $CuInS_2$ (indium copper sulfide), $CuInSe_2$ (indium copper selenide), $CuInTe_2$ (indium copper telluride), $AgInS_2$ (indium silver sulfide), $AgInSe_2$ (indium silver selenide), $AgInTe_2$ (indium silver telluride), etc., or the mixed solid solution of the compounds selected from the compound group described above.

Also, to control the carrier concentration, an impurity can be introduced or the above-described material having a deviated composition ratio can be used. However, the invention is not limited to the above-described compound semiconductors. It is preferred that the compound semiconductor described above is $CuInS_2$, $CuInSe_2$, $CuGaSe_2$ or the mixed crystal compound semiconductor made of the combination of them. The above-described compound semiconductor group is known as so-called chalcopyrite-type structure compound semiconductor and p-type conductive type is liable to be made. Also, in the compound semiconductors, because the above-described preferred compound semiconductors show a large light absorption in a visible light region, many carriers by a light excitation can be generated.

Also, the compound semiconductor constituted of the elements belonging to the groups IIb and VIb may be at least one compound semiconductor selected from ZnSe (zinc selenide), ZnTe (zinc telluride), and CdTe (cadmium telluride). The compound semiconductor of CdTe, ZnTe, or a mixed crystal system by the combination of them is preferred. Also, to carry out the control of the carrier concentration, etc., the above-described described material having introduced therein an impurity or having changed the composition thereof can be used. However, the invention is not limited to the above-described compound semiconductors. The compound semiconductor has a wurtzite type crystal structure known as so-called group II to VI compound semiconductors and shows a limited loss of electron transition by light excitation because the electron transition is of a direct type. Also, in the compound semiconductor, the conductive type can be easily made an amphoteric type or a p-type and the carrier concentration can be controlled by the induction of an impurity. Furthermore, the compound semiconductor may be a compound constituted of the elements belonging to group Ib and group VIb. For example, the compound semiconductor constituted by the elements of groups Ib and VIb may be $Cu_2S$ (copper sulfide) or $Cu_2Se$ (copper selenide). Also, to carry out the control of the carrier concentration, etc., an impurity can be introduced or the above-described material having a deviated composition can be used. However, the invention is not limited to the above-described compound semiconductor. In the above-described compound semiconductor, the conductive type becomes a p type by the stoichiometric composition and thus the preparation thereof is easy.

However, not only the compound semiconductors constituted of the elements in the periodic table described above but also the positive hole induced in the above-described sensitizing dye by the irradiation of sunlight may move to the counter electrode opposite to the oxide type semiconductor electrode.

Also, in the above-described solar cell of the invention, not only by the absorption of light with the sensitizing dye but also by using the compound semiconductor, which is the material having a large light absorption coefficient, as the above-described semiconductor layer, the dynamic range of absorption can be enlarged. By the techniques described above, the light conversion efficiency of the solar cell can be improved. Also, the reduction of the cost for the production of the solar cell can be realized by the electrolytic deposition method.

Also, the light of the visible region in the following descriptions means the range of the wavelength of from about 350 to 950 nm, which corresponds to the energy of from about 3.5 to 1.0 eV.

[Solar Cell]

The fundamental construction of the solar cell of the invention has a transparent electrically conductive film on a transparent insulating substrate, has thereon a transparent porous semiconductor layer transmitting a light of the visible region, and further has thereon a compound semiconductor layer which is a layer of absorbing light.

It is preferred that the solar cell of the invention has a buffer layer (dense layer) constituted of the same material as the porous semiconductor layer between the transparent conductive film and the porous semiconductor layer. Also, in the solar cell of the invention, it is preferred that the porous semiconductor layer contains a sensitizing dye.

Figure 3:
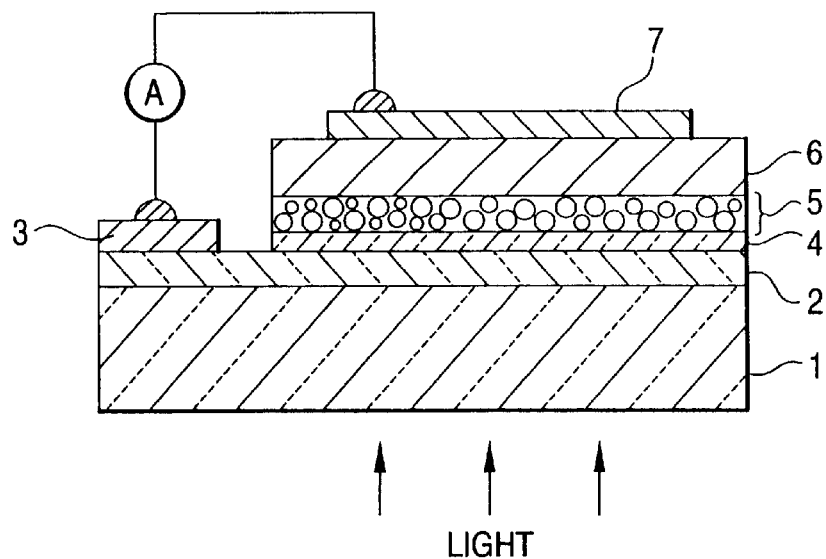
FIG. 3 is schematic cross-sectional views showing the solar cells prepared in Examples 1 to 3.

FIG. 3 is a cross-sectional view showing the construction of one embodiment of the solar cell of the invention. In the embodiment, a transparent conductive film 2 is formed on a transparent insulating substrate 1 such as a glass substrate, etc., and a buffer layer 4, a porous semiconductor layer 5, and a compound semiconductor layer 6 are successively laminated thereon. The solar cell is a super straight type and a sunlight enters the substrate 1 side, that is, from the lower portion in FIG. 3.

A metal electrode 3 is formed on the transparent conductive film 2 connected thereto as a lower electrode and a metal electrode 7 is formed on the compound semiconductor layer 6 as an upper electrode.

As the conductive type of the porous semiconductor layer 5, there can be an n-type and a p-type but for carrying out the incident of light from the porous semiconductor layer side and using the porous semiconductor layer as a window layer, it is preferred from the viewpoint of the light transmittance that the conductive type of the porous semiconductor layer 5 is an n-type. Also, in an oxide semiconductor, a p-type semiconductor also exists but the production is difficult and thus, an n-type is preferred from the viewpoint of productivity.

The compound semiconductor layer 6 is used as a light absorption layer because of the good light absorption of the compound semiconductor itself. Accordingly, in the case of using the p-type semiconductor, the life of the hole formed after exciting an electron by the irradiation of light is relatively long, whereby the short-circuit electric current can be increased, and the use of the p-type semiconductor is suitable for the electron exciting by light.

In the construction described above, the compound semiconductor layer 6 functions as a light absorption layer but the generation of carriers by light excitation mainly occurs at the bonded interface. That is, the porous semiconductor layer 5 is formed with a material transparent to a visible light and functions as a window layer, the carriers mainly generate at the bonded interface of the n-type porous semiconductor layer 5 and the p-type compound semiconductor layer 6. Now, in the embodiment of this invention, the porous semiconductor layer 5 has a porous structure constituted of many fine pores. In this case, by also being formed the compound semiconductor in the fine pores at the formation of the compound semiconductor layer 6, the area of the bonded interface of the porous semiconductor layer 5 and the compound semiconductor layer 6 is increased, whereby the carrier generating ratio and the energy conversion efficiency thereby are greatly improved.

Also, by such a porous structure of the porous semiconductor layer 5, the scattering effect of light caused at striking the compound semiconductor layer 6 with light is increased, whereby the utilization efficiency of light thereof is improved as compared with a compound semiconductor layer 6 having flat surface at the incident side of light.

Furthermore, by employing such a structure, the carrier vanishing ratio is lowered, whereby more light-excited carriers can be obtained as a photoelectric current as well as the light entrapping effect can be improved, and by these effects, the energy conversion efficiency of the solar cell can also be improved.

Also, in the embodiment shown in FIG. 3, the buffer layer 4 is further formed between the transparent conductive film 2 and the porous semiconductor layer 5. The buffer layer 4 is formed by a dense structure, that is, the structure of not a porous structure, using the same material transparent to a visible light as the material of the porous semiconductor layer 5. By forming such a buffer layer 4, the leaking electric current of carriers generated in the compound semiconductor layer 6 can be prevented and also lowering of the efficiency of the solar cell can be restrained. However, the buffer layer 4 is not always necessary, and may be formed in the case that the value of the leaking electric current is particularly large to cause a problem.

Figure 5:
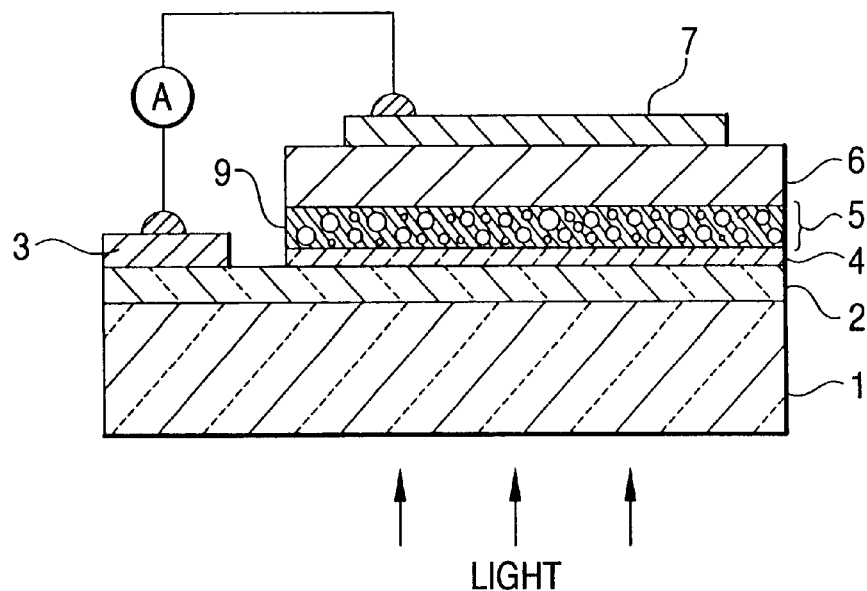
FIG. 5 is schematic cross-sectional views of the solar cells prepared in Examples 5 and 6.

FIG. 5 is a cross-sectional view showing other embodiment of the solar cell of the invention. In the embodiment, a sensitizing dye 9 is adsorbed onto the surface of a porous semiconductor constituting a porous semiconductor layer 5. The sensitizing dye is used for the purpose of making matching of the absorption characteristics of the porous semiconductor layer and sunlight and by adsorbing the sensitizing dye, the spectral sensitization becomes effective. In this case, the use of, particularly, a visible light sensitizing dye in the sensitizing dyes is preferred for generating a high photoelectric motive force by effectively absorbing sunlight.

(Transparent conductive film)

In the solar cell of the invention, it is preferred that the material of the transparent conductive film accumulated on the transparent insulating substrate is constituted of at least one of ZnO (zinc oxide), $SnO_2$ (tin oxide), $In_2O_3$ (indium oxide), and $SnO_2$-$In_2O_3$ (solid solution of tin oxide and indium oxide, ITO). Also, the material of the transparent conductive film may contain an impurity for lowering the resistance thereof.

In the solar cell of the invention, to enter a light from the transparent insulating substrate, it becomes necessary that the transmittance of light in the visible light region even in a low resistance, and because the transparent conductive film described above has the absorption end of a light wavelength of 350 nm, the incident of a visible light into the above-described compound semiconductor layer becomes possible.

(Porous Semiconductor Layer)

porous semiconductor:

The above-described porous semiconductor layer is constituted of a porous semiconductor and it is preferred that the porous semiconductor is made of a metal oxide from the viewpoints of the transmittance of light and capability of increasing the porosity. The metal oxide is preferably at least one of $TiO_2$ (titanium oxide), ZnO (zinc oxide), and $Nb_2O_3$ (niobium oxide) and also the metal oxide is preferably used as an n-type oxide semiconductor. In particular, titanium oxide is preferred from the viewpoint of making the porosity larger. Also, to control the carrier concentration, etc., an impurity can be introduced or the above-described material having a changed composition ratio can be used.

The porous semiconductor is required to be transparent same as the above-described transparent conductive film but as compared with CdS usually used as a window layer in a solar cell by a thin-film compound semiconductor, the above-described porous semiconductor has a large band gap of at least 3 eV, scarcely generates carriers by the light excitation in the visible light region, and is preferably as the window layer. Also, as compared with CdS, in the porous semiconductor, the control of the surface formation is easy and the semiconductor can be easily made porous.

In addition, with regard to the buffer layer, the same semiconductor material as the porous semiconductor layer is used but in the case of the buffer layer, the material is not made to be porous.

[Production Method of Solar Cell]

Then, the production method of solar cell of this invention is described.

The coating film (porous semiconductor layer) of the above-described porous semiconductor material can be accumulated by a known method such as a metal anodic oxidation method, a cathodic deposition method, a screen printing method, a sol-gel method, a thermal oxidation method, a vacuum vapor deposition method, a dc or rf sputtering method, a chemical vapor-phase deposition method, an organometal chemical vapor-phase deposition method, a molecular beam deposition method, a laser ablation method, etc. Also, by combining the above-described deposition methods, the coating film of the porous semiconductor material may be prepared. In particular, the semiconductor electrode preparation method described in Japanese patent Laid-Open No. 144772/1999, which is a known technique, is more preferred as a method of forming the coating film of the porous semiconductor material.

The coating film (compound semiconductor layer) of the above-described compound semiconductor material can be deposited by a known method such as a metal anodic oxidation method, a cathodic deposition method, a screen printing method, a sol-gel method, a vacuum vapor deposition method, a dc or rf sputtering method, a chemical vapor-phase deposition method, an organometal chemical vapor-phase deposition method, a molecular beam deposition method, a laser ablation method, etc. Also, the coating film of the compound semiconductor material may be formed by combining the above-described deposition methods. In these methods, the cathodic deposition method and the screen printing method are more preferred.

(Formation Method of Porous Semiconductor Layer)

As one method of forming the porous semiconductor layer of the solar cell of the invention, there is a method including a 1st step of forming a composite gel by reacting a metal oxide precursor and a compound having at least one functional group causing an interaction with the metal oxide precursor in a solution containing the metal oxide precursor and the compound to obtain a dispersed sol of a colloid made of metal oxide fine particles and a 2nd step of coating the dispersed sol on a support followed by drying or burning to form a porous semiconductor layer having fine pores on the transparent conductive layer on the transparent insulating substrate (hereinafter, sometimes referred to as "composite gelling method")

Because in the above-described 1st step, the formation reaction of the metal oxide fine particles proceeds in a gel wherein a diffusion is restrained, the formation of coarse particles and the precipitation of particles do not occur, and a colloid dispersed sol liquid wherein fine particles having fine particle sizes are uniformly dispersed can be obtained. In a so-called sol-gel method, a metal oxide precursor each other, for example, in the case of a metal alkoxide, the compound is gelled by causing an hydrolysis and dehydrating condensation reaction, but in this case, a chemically strong three-dimensional bond network of —M—O—M— (wherein M is a metal element and O is an oxygen atom) is formed, the network cannot be soled again, and when they are once gelled, working by coating, etc., cannot be carried out. On the other hand, in the above-described method of obtaining a composite gel by reacting a metal oxide precursor in a solution containing the metal oxide precursor and the compound causing an interaction with the metal oxide precursor, by utilizing the property of the interaction of the compound causing an interaction with the metal oxide precursor, the reaction product can be soled again and an excellent workability is obtained.

In this case, as the above-described metal oxide precursor, there are metal compounds soluble in a solvent used, such as metal halides, metal complex compounds, metal alkoxides, metal carboxylates, chelate compounds, etc. Specific examples of the compound include metal halides such as $TiCl_4$ (titanium tetrachloride), $ZnCl_2$ (zinc chloride), $WCl_6$ (tungsten hexachloride), $SnCl_2$ (stannous chloride), $SrCl_6$ (strontium chloride), etc.; nitrates such as $Ti(NO_3)_4$ (titanium nitrate), $Zn(NO_3)_2$ (zinc nitrate), $Sr(NO_3)_2$ (strontium nitrate), etc.; metal alkoxides represented by the formula $M(OR)_n$ (wherein M is a metal element, R is an alkyl group, and n is the oxidation number of the metal element), etc.

Examples of the above-described metal alkoxide include zinc diethoxide, tungsten hexaethoxide, vanadyl ethoxide, tin tetraisopropoxide, strontium diisopropoxide, etc.

Now, for the formation of a composite metal oxide layer such as the layer of strontium titanate, etc., a double alkoxide containing simultaneously two or more kinds of metals as the components in the molecule can be used. In the case of forming, for example, the metal oxide layer of titanium oxide, examples of the metal alkoxide preferably used include titanium tetra-iso-propoxide, titanium tetra-n-propoxide, titanium tetraethoxide, titanium tetra-n-butoxide, titanium tetra-iso-butoxide, titanium tetra-t-butoxide, etc.

Also, as the functional group causing an interaction with the above-described metal oxide precursor, there are a carboxyl group, an amino group, a hydroxyl group, etc. Also, as the functional group causing an interaction with the above-described metal oxide precursor, a compound having at least one kind of the above-described functional group, such as an amic acid structure may be used. Also, the compound having at least one kind of a functional group causing an interaction with the metal oxide precursor is a compound having at least one kind of a functional group selected from a carboxyl group, an amino group, a hydroxyl group, and an amino acid structure. High molecular compounds are particularly preferred. Specific examples of such a low molecular compound include a dicarboxylic acid, diamine, diol, diamic acid, etc.

Also, as the specific examples of the high molecular compound, there are high molecular compounds each having at least one of a functional group selected from a carboxyl group, an amino group, a hydroxyl group, and an amic acid structure at the main chain, a side chain, or a crosslinked portion. There is no particular restriction on the main chain structure of the above-described high molecular compound but there are ones having optional structures such as a polyethylene-base structure, a polystyrene-base structure, a polyacrylate-base structure, a polymethacrylate-base structure, a polycarbonate-base structure, a polyester-base structure, a cellulose-base structure, a silicone-base structure, a vinylic polymer structure, a polyamide-base structure, a polyamide-imide-base structure, a polyurethane-base structure a polyurea-base structure, etc., and the copolymer structures of them.

Also, as the above-described high molecular compounds each having at least one of a functional group selected from a carboxyl group, an amino group, a hydroxyl group, and an amic acid structure at the main chain, a side chain, or a crosslinked portion, the use of polyacrylic acid having a carboxyl group at the side chain is particularly preferred from the viewpoint of having a proper form of causing an interaction with the metal oxide precursor. Furthermore, the high molecular compound having at least one kind of a functional group causing an interaction with the metal oxide precursor may be a copolymer of the high molecular compound having a functional group causing the interaction and a high molecular compound having the main chain structure as described above and without having a carboxyl group, an amino group, a hydroxyl group, and a amic acid structure. The high molecular compounds each having at least one kind of a functional group causing an interaction with the metal oxide precursor may be used as a mixed system of two or more kinds of them, or as a mixed system with the high molecular compound having the main chain structure as described above and without having a carboxyl group, an amino group, a hydroxyl group, and an amic acid structure according to the purposes. The mean polymerization degree of the high molecular compounds each having at least one kind of a functional group causing an interaction with the metal oxide precursor is preferably from about 100 to 10,000,000, and more preferably from about 5000 to 250,000.

As the solvent used for forming the porous semiconductor layer, a solvent dissolving alcohols such as methanol, ethanol, isopropanol, butanol, etc. and the metal oxide precursors such as formaldehyde, dimethyl formaldehyde, dioxane, benzene, etc. without causing reaction with the metal oxide precursor can be used.

Then, taking the case of using a metal alkoxide as the metal oxide precursor, the formation method of the porous semiconductor layer is described in detail.

First, the metal alkoxide described above is added to the solvent (e.g., an organic solvent such as an alcohol). Furthermore, water necessary for partially hydrolyzing the metal alkoxide and an acid such as hydrochloric acid, nitric acid, sulfuric acid, acetic acid, etc., as a catalyst are added thereto. In this case, the amounts of water and the acid can be properly selected according to the extent of the hydrolyzing property of the metal alkoxide. Then, the mixed solution obtained is heated (or refluxed) to a temperature of from room temperature to 150° C. (preferably, from room temperature to 100° C.) under a nitrogen gas stream with stirring. The refluxing temperature and time can also be properly selected according to the hydrolyzing property of the metal oxide precursor to be used. As the result of refluxing, the metal alkoxide becomes a partially hydrolyzed state. That is, because the amount of above-described water contained in the mixed solution is small to an extent of not sufficiently hydrolyzing the alkoxy group of the metal alkoxide, in the metal alkoxide shown by the formula $M(OR)_n$ described above, only a part of the —OR groups is hydrolyzed and as a result, the metal oxide becomes a partially hydrolyzed state. In the metal alkoxide of the partially hydrolyzed state, a polycondensation reaction does not proceed. Thus, although the chain of —M—O—M— is formed between the metal alkoxides, the metal alkoxide is in an oligomer state. The mixed solution containing the metal alkoxide in an oligomer state after the reflux is colorless and transparent and the viscosity thereof scarcely increases.

Then, the temperature of the mixed solution after the reflux is lowered to room temperature and a high molecular compound having at least one functional group selected from a carboxyl group, an amino group, a hydroxy group, and an amino acid structure (preferably, polyacrylic acid) is added to the solution. In this case, the high molecular compound which is fundamentally hard to dissolve in an organic solvent such as an alcohol is easily dissolved in the mixed solution to obtain a transparent sol. This is considered to be caused by that the carboxyl group of the high molecular compound is bonded to the metal alkoxide by a salt-forming reaction and a compound of a high molecular complex state is formed. The transparent sol is usually a colorless and transparent homogeneous solution.

By further adding an excessive amount of water to the transparent sol and further continuing the reaction by keeping the temperature to a temperature of from room temperature to 150° C., preferably from room temperature to 100° C., the transparent sol is gelled within a time of from about several minutes to 1 hour to form a composite gel having crosslinking structure of the high molecular compound and the metal alkoxide.

When the composite gel is maintained for 5 to 50 hours at a temperature of from room temperature to about 90° C. (usually, at about 80° C.) to continue the reaction, the composite gel is dissolved again to obtain a translucent metal oxide fine particle colloid dispersed sol. This is caused by that by the hydrolysis reaction of the metal alkoxide, a polycondensation reaction proceeds and also the salt structure of the high molecular compound and the metal alkoxide is decomposed to form metal oxide fine particles and a carboxylic acid ester, etc.

The translucent metal oxide fine particle colloid dispersed sol obtained in the above step is coated on a transparent conductive film accumulated on a transparent insulating substrate followed by drying or burning to form a metal oxide film having fine pores.

There is no particular restriction on the coating method of the metal oxide fine particle colloid dispersed sol and a known coating method can be used. Specifically, there are a dip coating method, a spin coating method, a wire bar coating method, a spray coating method, etc. Also, for drying, for example, air-drying, drying which is carried out using a dryer such as an oven, etc., a vacuum lyophiliztion, etc., can be used. Also, a method of evaporating the solvent using an instrument such as a rotary evaporator, etc., may be used. In this case, the drying temperature and time can be properly selected according to purposes.

Also, it sometimes happens that according to the drying temperature, by only drying (removal of liquid components including the solvent) the metal oxide fine particle colloid dispersed sol, the high molecular compound or the reaction products thereof cannot be removed. In such a case, it is preferred to carry out burning to obtain the pure metal oxide by removing these components. The burning can be carried out using, for example, a furnace, etc., and the burning temperature differs according to the kind of the high molecular compound having a functional group used but a temperature of at least about 400° C. is generally employed.

By the burning, the crystallization of the metal oxide fine particles and sintering of the metal oxide fine particles occur and at the same time, organic high molecular components are decomposed and vanished. By drying or burning described above, a porous semiconductor layer is obtained.

In the above-described formation of the porous semiconductor layer, because the formation reaction of the metal oxide fine particles proceeds in the composite gel wherein the diffusion is restrained, the formation of coarse particles, aggregations by the precipitation of the particles, etc., do not occur and a metal oxide fine particle colloid dispersed sol wherein super fine particles are uniformly dispersed can be obtained. Also, when the metal oxide precursor is an alkoxide, a molecular complex having a homogeneous phase is separated into a high molecular compound phase having a functional group causing an interaction and a metal oxide network phase through the steps of the hydrolysis reaction and the dehydrating polycondensation reaction, and a microphase separation structure is formed. Thus, a metal oxide layer having at least two kinds of fine pores of the macro holes formed among the fine particles and the macro holes formed among the fine particle aggregates is obtained.

The size of the metal oxide fine particles of the above-described metal oxide layer, the period of the metal oxide fine particle aggregate structure, the volume ratio of the metal oxide fine particle aggregate phase and the void phase, etc., can be controlled to desired extents by the addition amount of the compound having at least one functional group causing an interaction with the metal oxide precursor to the metal oxide precursor and the ratio of the solid components of the metal oxide precursor and the compound having at least one functional group causing an interaction with the metal oxide precursor to the whole mixed solution described above.

That is, when the addition amount of the compound having at least one functional group burning with the metal oxide precursor is increased, the volume ratio of the void phase in the metal oxide layer obtained is increased and when the ratio of the solid components of the metal oxide precursor and the compound having at least one functional group causing an interaction with the metal oxide precursor to the whole mixed solution described above is reduced, the period of the metal oxide fine particle aggregate structure becomes less and the density of the void phase is increased, but the size of the metal oxide fine particle itself becomes large.

The addition amount of the compound having at least one functional group causing an interaction with the metal oxide precursor to the metal oxide precursor differs according to the ratio of the above-described solid components to the above-described whole mixed solution and can be properly selected. The addition amount is generally from about 0.1 to 1 by weight ratio, and preferably from about 0.2 to 0.8 by weight ratio. When the addition amount of the compound having at least one functional group causing an interaction with the metal oxide precursor to the metal oxide precursor is reduced, the dense metal oxide layer having less macro holes is liable to form and when the addition amount is less than 0.1 by weight ratio, a large three-dimensional network of —M—O—M— is formed, whereby, as the case may be, the composite gel is not re-dissolved. Also, when the addition amount is increased exceeding 1 by weight, relatively large voids form and a transparent metal oxide layer is liable to form.

The above-described ratio of the solid components to the whole mixed solvent differs according to the addition amount of the metal oxide precursor and the compound having at least one functional group causing an interaction with the metal oxide precursor and thus can be properly selected, but is preferably from 1 to 10% by weight, and more preferably from 2 to 5% by weight. When the ratio is lower than 1% by weight, proceeding of the composite gelling reaction is slow, the metal oxide fine particles are formed in a transparent sol state having a high fluidity, and coarse particles are formed. On the other hand, the ratio exceeds 10% by weight, proceeding from a transparent sol to the composite gel is fast and it sometimes happens that a homogeneous composite gel is not obtained.

Then, taking the case of using titanium tetraisopropoxide as the metal alkoxide, the formation method of the porous semiconductor later is explained in more detail.

First, by adding titanium tetraisopropoxide to an alcohol, a mixed solution is prepared. In this case, water and an acid as a catalyst are added to the alcohol, it is preferred that the water is added in an amount of from about 0.1 mol times to equimolar times to titanium tetraisopropoxide and the acid is added in an amount of from about 0.05 mol times to 0.5 mol times to titanium tetraisopropoxide. The mixed solution obtained is refluxed under a dry nitrogen gas stream at a temperature of from room temperature to 80° C. with stirring. It is preferred that the refluxing temperature and time are from about 30 minutes to 3 hours at about 80° C. As the result of the refluxing, a transparent mixed solution is obtained.

In the mixed solution, titanium tetraisopropoxide is in a partially hydrolyzed state and in an oligomer state. The temperature of the mixed solution is lowered to room temperature and polyacrylic acid is added. Polyacrylic acid, which is fundamentally hard to dissolve in an alcohol, is easily dissolved in the mixed solution to obtain a colorless and transparent sol. This is because the carboxylic acid of polyacrylic acid is bonded with titanium tetraisopropoxide by a salt-forming reaction to form a high molecular complex compound. When an excessive amount of water is added to the transparent sol and the mixture is maintained at a temperature of from room temperature to 80° C., the transparent sol is gelled in from several minutes to about 1 hour, and a composite gel of a crosslinked structure containing at least polyacrylic acid and titanium tetraisopropoxide is formed.

When the composite gel is maintained at about 80° C. for from about 5 to 50 hours, the composite gel is dissolved again to obtain a translucent sol. This is because the hydrolysis and the polycondensation reaction of titanium tetraisopropoxide proceed and also the salt structure of polyacrylic acid and titanium tetraisopropoxide is decomposed to change into titanium oxide and a carboxylic acid ester.

The sol solution obtained is coated on a proper substrate by a dip coating method, etc., and the coated layer is heated to a high temperature of at least about 400° C. By the heating, the crystallization of the titanium oxide fine particles and sintering of the titanium oxide fine particles each other proceed and at the same time, a high molecular phase is thermally decomposed to form film-form titanium oxide fine particles wherein titanium oxide is aggregated in a phase-separation state.

The amount of titanium tetraisopropoxide.to polyacrylic acid is preferably from about 0.3 to 0.7 by weight ratio. When the weight ratio is less than 0.3, a large three-dimensional network of —M—O—M— is formed and the gel is not sometimes dissolved, while when the weight ratio exceeds 0.7, it sometimes happens that relatively large voids form and the layer formed becomes transparent.

The ratio of the solid components of titanium tetraisopropoxide and polyacrylic acid to the above-described whole mixed solution is preferably from 1 to 10% by weight. When the ratio is less than 1% by weight, the composite gelling reaction proceeds slowly, titanium fine particles are formed in a high sol state of a high fluidity, and coarse titanium particles are sometimes formed. On the other hand, when the ratio exceeds 10% by weight, proceeding from the transparent sol to the composite gel is fast and the homogeneous composite gel is not sometimes obtained.

(Formation Method of Compound Semiconductor Layer)

First formation method:

In the 1st formation method of the compound semiconductor layer, a transparent porous semiconductor layer transmitting a light in the visible light region formed on a transparent conductive layer on a transparent insulating substrate, and a counter electrode to the porous semiconductor layer are disposed in an electrolyte containing at least the ion of the element to bedeposited, and an oxidation reduction reaction is electrochemically caused between the porous semiconductor layer and the counter electrode to the porous semiconductor layer to form the compound semiconductor layer on the porous semiconductor layer ("Hyomen Gijyutsu (Surface Technology)", Vol. 49, No. 1, page 13, 1998).

The above-described method is called an electrodeposition method and is a method that the ion of the constituting element in the electrolyte is reduced by an electric current and a compound semiconductor is deposited on the cathode layer of the porous semiconductor layer. Examples of the compound semiconductor prepared by the method include $CuGaS_2$ (gallium copper oxide), $CuGaSe_2$ (gallium copper selenide), $CuGaTe_2$ (gallium copper telluride), $CuInS_2$ (indium copper sulfide), $CuInSe_2$ (indium copper selenide), $CuInTe_2$ (indium copper telluride), $AgInS_2$ (indium silver sulfide) $AgInSe_2$ (indium slver selenide), $AgInTe_2$ (indium silver telluride), $ZnSe$ (zinc selenide), $ZnTe$ (zinc telluride), $CdTe$ (cadmium telluride), $Cu_2S$ (copper sulfide), $Cu_2Se$ (copper selenide), etc.

For the electrolyte described above, a mixture of solutes such as sulfates, chlorides, etc., becoming raw material elements in a solvent are used and as the solvent of the electrolyte, water (pure water, distilled water, etc.) is used. However, when a voltage generating hydrogen by the hydrolysis of water is applied at base, as the solvent, an organic material can be used as a nonaqueous solution. As the organic solvent, acetonitrile, dimethylformamide, propylene carbonate, etc., can be used. Also, as the nonaqueous solution, an inorganic nonaqueous solution such as liquid ammonia, liquid sulfide dioxide, etc., can be used as the above-described solvent.

The solute contains the elements constituting the compound semiconductor coated over the porous semiconductor layer, such as a sulfate, a chloride, etc., and may be dissolved in the above-described solvent. Examples of the sulfate include ferrous sulfate, indium sulfate, gallium sulfate, silver sulfate, zinc sulfate, cadmium sulfate, etc. Examples of the chloride include ferrous chloride, indium chloride, gallium chloride, silver chloride, zinc chloride, cadmium chloride, etc. They are used as reduction type solutes. The solute used in the invention is not limited to the above-described compounds, and they may be used singly or as a mixture of two or more kinds of them. Also, as the solute, selenium oxide, selenium hydroacid, tellurium oxide, tellurium hydroacid, sodium thiosulfate, thiourea, etc., can be used as an oxidation type solute.

When the oxidation type solute as described above is used, the accumulation of the element ion(s) contained in the oxidation type elute can be accelerated by controlling the hydrogen ion concentration. The hydrogen ion concentration can be controlled by a controlling agent such as sulfuric acid, hydrochloric acid, etc. The hydrogen ion concentration controlled by the controlling agent is preferably from pH 0.9 to 4.0, and more preferably from pH 1.5 to 2.5.

As the above-described electrolyte, in addition to the compounds described above, a supporting electrolyte made of an inert substance which does not contribute the electrolytic reduction can be added into the electrolysis to obtain an electric conductivity of the electrolysis. Examples of the supporting electrolyte are $NaClO_4$ (sodium chlorate), $LiClO_4$ (lithium chlorate), etc. The content of the supporting electrolyte is preferably from about 0.05 to 1 mol/liter.

To increase the adhesion necessary at proceeding the accumulation of the compound semiconductor, an additive can be added to the electrolyte. Examples of the additive include amine, alkaloid, sulfonic acid, mercaptan, sulfide, etc.

In the case of applying a voltage between the transparent porous semiconductor layer transmitting a light of the visible light region and the counter electrode to the porous semiconductor layer disposed in the electrolyte, as a 3rd electrode, a reference electrode can be used as a voltage standard electrode. That is, a reference electrode can be used for controlling a definite voltage or electric current between the porous semiconductor layer and the counter electrode to the porous semiconductor layer. As the reference electrode, a standard hydrogen electrode, a saturated calomel electrode, a standard silver-silver chloride electrode, a standard mercury oxide electrode, etc., can be used.

As the counter electrode to the porous semiconductor layer disposed in the electrolyte, a material which is hard to be dissolved in the solution by the application of voltage, that is a material having a small ionization tendency can be used. For example, as such a material, there are platinum (Pt), gold (Au), silver (Ag), etc.

It is preferred that the voltage applied between the transparent porous semiconductor layer transmitting a light in the visible light region and the counter electrode to the porous semiconductor layer disposed in the electrolyte is base lower than the oxidation reduction potential of the element ion of the compound containing the element constituting the compound semiconductor to be deposited contained in the electrode.

The content of the compound contained in the electrolyte is preferably from about 5 to 400 mmols/liter, more preferably from 5 to 20 mmols/liter in a reduction type element ion accumulation, and more preferably from about 100 to 400 mmols/liter in an oxidation type element iondeposition. The temperature of the solution described above is preferably from about 20 to 100° C., and more preferably from about 22 to 70° C.

The voltage application time at the formation of the compound semiconductor layer is preferably from about 300 to 3,600 seconds, and more preferably from about 800 to 2400 seconds.

Also, the compound semiconductor accumulated in the above-described method can be burned and crystallized. The crystallization temperature depends upon the kind of the compound semiconductor to be accumulated but is preferably from about 50 to 600° C., and more preferably from about 150 to 600° C. The time for the crystallization is preferably from about 1 to 60 minutes, and more preferably from about 15 to 30 minutes.

Second formation method:

In the 2nd formation method of a compound semiconductor layer, a transparent porous semiconductor layer transmitting a light of the visible light region formed on the transparent conduct film on a transparent insulating substrate is disposed in a solution containing at least one kind of an ion to be accumulated and the reduction reaction is caused by controlling the temperature of the solution and controlling the ion concentration to form the compound semiconductor layer on the porous semiconductor layer ("Journal of Applied Physics", Vol. 82, 2, 665, (1997)).

The method is called a chemical bath deposition method, wherein an element ion is formed by an oxidizing agent or a reducing agent, a complex-forming agent is added thereto to stabilize the ion, a buffer is added thereto for preventing the deviation of the hydrogen ion concentration, and a stabilizer is added thereto for preventing the occurrence of a spontaneous decomposition in the solution, and by the oxidation reduction reaction of them it becomes possible to accumulate the compound semiconductor on the porous semiconductor layer. There is no particular restriction on the compound semiconductor prepared by the method but there are, for example, ZnSe (zinc selenide), ZnTe (zinc telluride), CdTe (cadmium telluride), $Cu_2S$ (copper sulfide), $Cu_2Se$ (copper selenide), etc.

In the above-described solution, a mixture of solutes such as a sulfate, a chloride, etc., which become ions in the solution are used. As the solvent, water (pure water, distilled water, etc.), etc., are used. Also, an organic solvent can be used and, for example, acetonitrile, dimethylformamide, propylene carbonate, etc. can be used. Furthermore, an inorganic nonaqueous solution such as liquid ammonia, liquid sulfur dioxide, etc., can also be used.

The solute may contain the elements constituting the compound semiconductor to be accumulated on the porous semiconductor layer, such as a sulfate, a chloride, etc. Examples of the sulfate include cuprous sulfate, indium sulfate, gallium sulfate, silver sulfate, zinc sulfate, cadmium sulfate, etc. Also, examples of the chloride include cuprous chloride, indium chloride, gallium chloride, silver chloride, zinc chloride, cadmium chloride, etc.

As the solute described above, selenium oxide, selenium hydroacid, tellurium oxide, tellurium hydroacid, sodium thiosulfate, thiourea, etc., can be preferably used.

When the compound as described above is used, by controlling the hydrogen ion concentration, the deposition of the element ion contained in the compound can be accelerated. As the controlling agent for controlling the hydrogen ion concentration, for example, basic compounds such as sodium hydroxide, ammonium hydroxide, etc., inorganic acids, organic acids, etc. can be used. Also, as the buffer used for restraining the occurrence of the deviation of the hydrogen ion concentration, sodium citrate, sodium acetate, an oxycarboxylic acid-base buffer, inorganic acids having a small dissociation constant such as boric acid, carbonic acid, etc.; and the alkali salts of organic acids or inorganic acids can be used.

Also, as the complex-forming agent, ammonium hydroxide, sodium citrate, sodium acetate, ethylene glycol, etc. can be used.

As the stabilizer, a chloride, sulfide, and nitrate of lead, etc. can be used. The concentration of the compound containing the raw material elements constituting the compound semiconductor is preferably from about $1.0 \times 10^{-3}$ to 2 mols/liter, and more preferably from about $2.0 \times 10^{-2}$ to 1 mol/liter.

The temperature of the above-described solution is preferably from about 20 to 100° C., and more preferably from about 22 to 70° C. Also, the forming time of the compound semiconductor layer is preferably from about 300 to 3,600 seconds, and more preferably from about 120 to 2,400 seconds.

Also, the compound semiconductor accumulated in the above-described step can be crystallized by burning. The crystallization temperature depends upon the kind of the accumulating compound semiconductor but is preferably from about 50 to 600° C., and more preferably from about 150 to 550° C. The crystallization time is preferably from about 1 to 60 minutes, and more preferably from 15 to 30 minutes.

Third formation method:

In the 3rd formation method of the compound semiconductor layer, a transparent porous semiconductor layer transmitting a light of the visible light region formed on the transparent conductive film on a transparent insulating substrate is disposed in the solution containing at least sodium thiosulfate and at least one kind of a metal ion, the porous semiconductor layer is irradiated with ultraviolet rays to cause a photoreaction, whereby the compound semiconductor layer is formed on the porous semiconductor layer ("Japan Journal Applied Physics", Vol. 36, L1146, 1997).

The method is called a photochemical deposition method, wherein a compound-forming reaction is caused by the photoexcitation of the ions (thiosulfate ion, etc.) in the solution and the film thickness can be easily controlled by the presence or absence of the irradiation of light and by changing the intensity of the irradiating light. There is no particular restriction on the compound semiconductor prepared by the method, but there are, for example, $CuGaS_2$ (gallium copper sulfide), $CuInS_2$ (indium copper sulfide), $AgInS_2$ (indium silver sulfide), $Cu_2S$ (copper sulfide), etc.

As the solution described above, a mixture of solutes such as a sulfate, a chloride, etc., which become ions in the solvent, is used.

The solute may contain the elements constituting the compound semiconductor to be accumulated on the porous semiconductor layer, such as a sulfate, a chloride, etc. Examples of the sulfate include cuprous sulfate, indium sulfate, gallium sulfate, cadmium sulfate, etc. Also, examples of the chloride include cuprous chloride, indium chloride, gallium chloride, cadmium chloride, etc.

The solute used in the method is not limited to the above-described compounds, and these compounds may be used singly or as a mixture of two or more kinds of them. When the oxidation type compound as described above is used, by controlling the hydrogen ion concentration, the accumulation of the element ions contained in the oxidation type compound can be accelerated. The hydrogen ion concentration can be controlled by a controlling agent such as sulfuric acid, etc.

The hydrogen ion concentration controlled with the controlling agent is preferably from pH 1.5 to 4.0, and more preferably from pH 2.5 to 3.5.

It is preferred that the above-described solution is stirred and in this case, it is preferred that the solution is stirred at about 60 rpm or lower. Furthermore, as the light for causing the photoexcitation, ultraviolet light is emitted by a high-pressure mercury light-source lamp or the like, the ultraviolet light is focused by a single convex lens, and the porous semiconductor layer disposed in the solution is irradiated with the light. It is preferred that the convex lens is made of a quartz glass.

The concentration of the above-described compound containing the raw material elements of the compound semiconductor in the solution is preferably from about 1.0 to 20 mmols/liter, and more preferably from about 2.0 to 10 mmols/liter. The temperature of the solution is preferably from about 20 to 40° C., and more preferably from about 22 to 35° C. Also, the formation time of the compound semiconductor layer is preferably from about 2,400 to 4,800 seconds, and more preferably from about 3,000 to 3,600 seconds.

Also, the compound semiconductors deposited in the three formation methods described above can be crystallized by burning. The crystallization temperature depends upon the kind of the compound semiconductor but is preferably from about 80 to 600° C., and more preferably from about 80 to 500° C. The time for the crystallization is preferably from about 1 to 60 minutes, and more preferably from about 15 to 30 minutes. Particularly, in the case of the sulfide-base compound, the temperature is preferably from about 80 to 400° C., in the case of the selenium-base compound, the temperature is preferably from about 300 to 550° C., and in the case of the tellurium-base compound, the temperature is preferably from about 400 to 600° C., and burning is not always necessary.

The solar cell of the invention can be suitably prepared by the production methods as described above but the method for producing the solar cell of the invention is not limited to these production methods.

Taking into consideration of the above-described matters, it is very suitable that in the solar cell of the invention, the compound semiconductor is $CuInS_2$ having a large absorption coefficient.

In the above-described semiconductor device of the invention, by giving an organic fluorescent substance to the organic layer or the organic monomolecular layer as the solar cell of the invention and by constituting the inorganic semiconductor layer prepared in the solution with a material capable of transmitting or reflecting a visible light, a light-emitting element can be realized.

Figure 4:
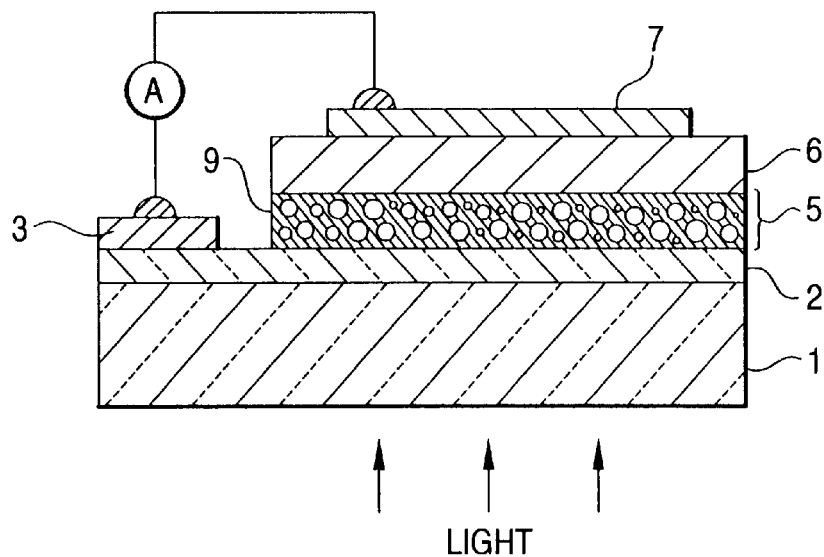
FIG. 4 is a schematic cross-sectional view of the solar cell prepared in Example 4.
Figure 6:
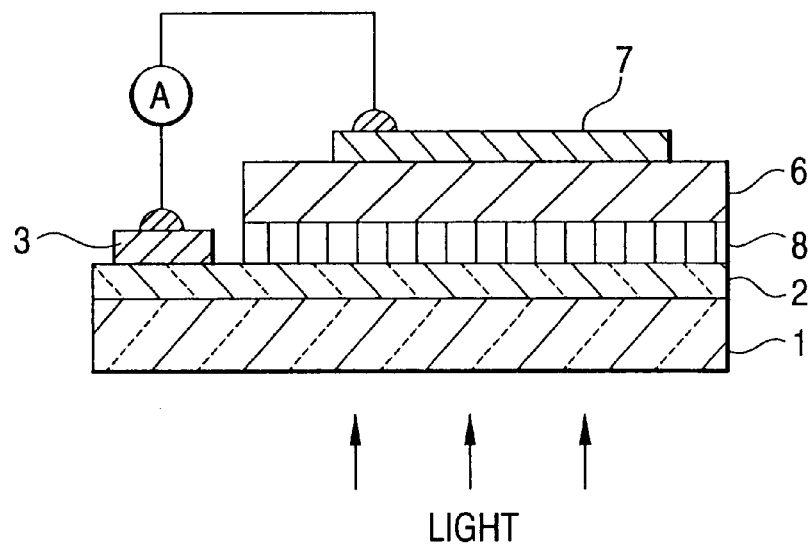
FIG. 6 is a schematic cross-sectional view of the solar cell prepared in Comparative Example 1.
Figure 7:
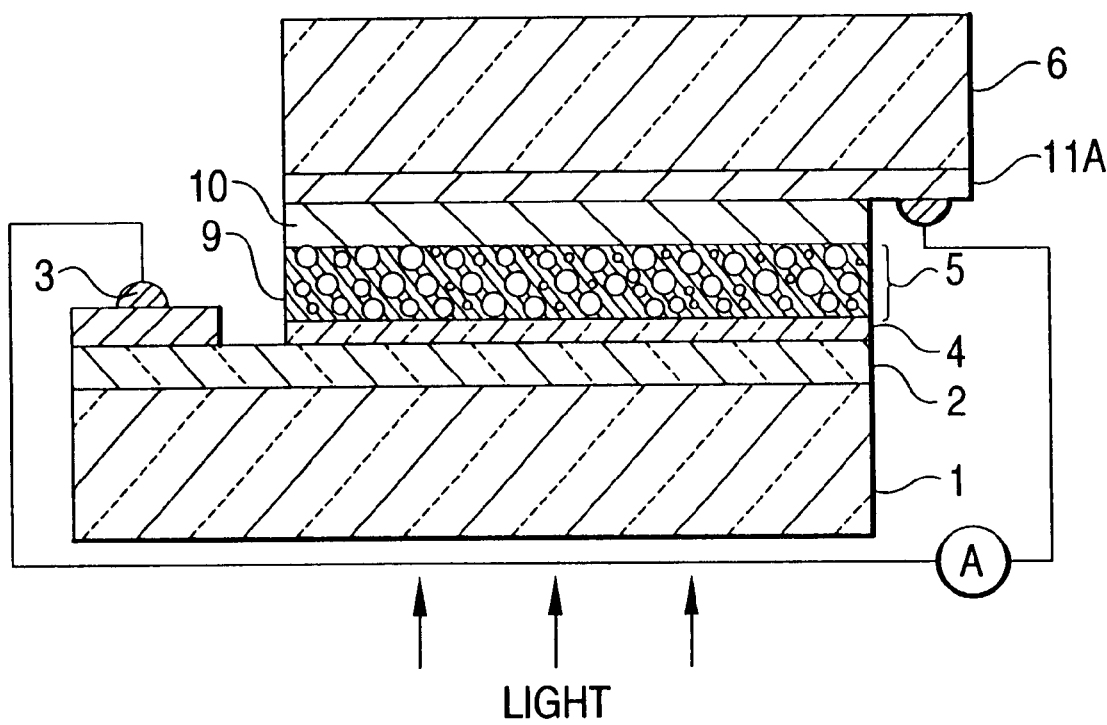
FIG. 7 is a schematic cross-sectional view of the solar cell prepared in Comparative Example 2.

Then, the examples of the invention are explained by referring to the accompanying drawings but the invention is not limited to these examples. In addition, FIG. 3 is the schematic cross-sectional views of the solar cells prepared in Examples 1 to 3, FIG. 4 is the schematic cross-sectional views of the solar cells prepared in Examples 4, FIG. 5 is the schematic cross sectional view of the solar cell prepared in Examples 5 and 6, FIG. 6 is the schematic cross sectional view of the solar cell prepared in Comparative Example 1, and FIG. 7 is the schematic cross sectional view of the solar cell prepared in Comparative Example 2.

EXAMPLE 1

As a transparent insulating substrate 1 shown in FIG. 3, a glass sheet was used and the upper surface thereof was coated with an ITO film as a transparent conductive film 2 at a thickness of about 10 μm by rf sputtering. Furthermore, Ag was coated as a lower metal electrode 3 of the transparent conductive film 2 by dc sputtering.

Then, a dense film of $TiO_2$ was coated at a thickness of about 0.2 μm as a buffer layer 4 using a Ti sol-gel solution.

The Ti sol-gel solution used was prepared by diluting 28.3 g of titanium isopropoxide with 100 ml of absolute ethanol and adding dropwise thereto a solution prepared by diluting 2.7 ml of 2N hydrochloric acid with 100 ml of absolute ethanol. The Ti sol-gel solution obtained was coated on the substrate with the ITO film, and after spin coating at 2,000 rpm for 40 seconds, burning was carried out at 500° C. for 20 minutes to form the buffer layer 4. In this case, the spin coating and the burning treatment described above were repeatedly carried out twice for realizing a desired film thickness.

Then, $TiO_2$ was formed as a porous semiconductor layer 5 at a thickness of 1.0 μm by the solution of a composite gelling method.

In this case, the solution by the composite gelling method was prepared by mixing 7 g of titanium isopropoxide, 20 ml of ethanol, 0.4 g of water, and 0.55 g of nitric acid at room temperature in a nitrogen gas atmosphere, and after allowing to stand in a nitrogen gas atmosphere for 2 hours, 2.5 g of polyacrylic acid was added to carry out hydrolysis followed by allowing to stand for 48 hours. The solution obtained was coated on a substrate having formed thereon the buffer layer 4, and after spin coating under the condition of 2,000 rpm for 40 seconds, burning was carried out at 450° C. for 20 minutes to form the porous semiconductor layer 5. In this case, spin coating and the burning treatment were repeatedly carried out 10 times for realizing the desired film thickness.

In addition, because the buffer layer 4 and the porous semiconductor layer 5 described above were formed by spin coating, these layers were formed on the lower metal electrode 3, in each time of carrying out the spin coating, ethanol was used as a solvent and the buffer layer 4 and the porous semiconductor layer 5 on the lower metal electrode 3 were wiped away with ethanol.

Then, the upper portion of the lower metal electrode 3 was covered by a resist. In the following examples, the same operation as above was carried out.

Furthermore, on the porous semiconductor layer 5 was deposited CdTe made of the elements of groups II and VI as a compound semiconductor layer 6 by an electrolytic deposition.

In this case, the electrolyte used for the electrodeposition was prepared by dissolving cadmium sulfate octa-hydrate, cadmium chloride hydrate, and tellurium oxide in water so that the concentrations of them became 20 mmols/liter, 20 mmols/liter, and 10 mmols/liter, respectively, and controlling the hydrogen ion concentration to 2.0 with sulfuric acid.

By using a platinum (Pt) electrode as a counter electrode, an Ag/AgCl electrode as a reference electrode, and the substrate having formed thereon the porous semiconductor layer 5 as a working electrode, CdTe was accumulated under the conditions of the aqueous solution temperature of 90° C., the reference electrode voltage of 20 mV, and the voltage applying time of 3,600 seconds. The film thickness of the CdTe compound semiconductor layer 6 formed was 2 μm.

Finally, platinum was deposited on the compound semiconductor layer 6 by dc sputtering to form an upper metal electrode 7, and thus a solar cell was prepared.

The solar cell prepared was irradiated with a light of AM of 1.5 and an intensity of 100 mW/cm² from the transparent insulating substrate 1 side and the characteristics (release voltage, short-circuit electric current, fill factor, and conversion efficiency) were measured and evaluated.

EXAMPLE 2

By following the same procedure as Example 1, a transparent conductive film 2, a lower metal electrode 3, a buffer layer 4, and a porous semiconductor layer 5 were formed on a transparent insulating substrate 1 shown in FIG. 3.

Furthermore, on the porous semiconductor layer 5 was deposited $Cu_2S$ made of the elements belonging to groups I and VI as a compound semiconductor layer 6 by a chemical bath deposition. The aqueous solution used for the chemical bath deposition was prepared by dissolving sodium thiosulfate and copper sulfate in water so that the concentrations of them became 400 mmols/liter and 30 mmols/liter, respectively.

The substrate having formed thereon the porous semiconductor layer 5 was immersed in the aqueous solution obtained under the conditions of 45° C. and for the immersion time of 10 minutes to deposit thereon $Cu_2S$. In this case, the film thickness of the $Cu_2S$ compound semiconductor layer 6 was 0.1 μm. Furthermore, burning was carried out in air at 150° C. to improve the crystallinity of the compound semiconductor.

Finally, platinum was deposited on the compound semiconductor layer 6 by dc sputtering to form an upper metal electrode 7, and thus a solar cell was prepared.

With regard to the solar cell prepared, the characteristics were evaluated as in Example 1.

EXAMPLE 3

By following the same procedure as Example 1, a transparent conductive film 2, a lower metal electrode 3, a buffer layer 4, and a porous semiconductor layer 5 were formed on a transparent insulating substrate 1 shown in FIG. 3.

Furthermore, $CuInS_2$ made of the elements belonging to groups I, III, and VI was deposited on the porous semiconductor layer 5 as a compound semiconductor layer 6 by photochemical deposition.

The aqueous solution used for the photochemical deposition was prepared by dissolving copper sulfate, indium sulfate, and sodium thiosulfate in water so that the concentrations of them became 30 mmols/liter, 15 mmols/liter, and 400 mmols/liter, respectively, and controlling the hydrogen ion concentration to 2.5 with sulfuric acid. The substrate having formed thereon the porous semiconductor layer 5 was immersed in the aqueous solution under the conditions of a liquid temperature of 25° C. for the immersion time of 60 minutes and the liquid-deposited portion was irradiated with a light formed by focusing a high-pressure mercury lamp light by a lens to deposit $CuInS_2$.

The amorphous $CuInS_2$ compound semiconductor was crystallized by burning at 400° C. for 30 minutes. In this case, the film thickness of the compound semiconductor layer 6 accumulated was 1.5 μm.

Finally, platinum was deposited on the compound semiconductor layer 6 by dc sputtering to form an upper metal electrode 7 and a solar cell was prepared.

With regard to the solar cell prepared, the characteristics were evaluated as in Example 1.

EXAMPLE 4

As a transparent insulating substrate 1 shown in FIG. 4, a glass sheet was used and an ITO film was coated on the glass sheet as a transparent conductive film 2 at a thickness of 10 μm by rf sputtering. Furthermore, Ag was coated as a lower metal electrode 3 on the transparent conductive film 2 by dc sputtering.

Then, $TiO_2$ was formed thereon as a porous semiconductor layer 5 at a thickness of 1.0 μm by a composite gel method.

In this case, the solution by the composite gel method was prepared by mixing 7 g of titanium isopropoxide, 20 ml of ethanol, 0.4 g of water, and 0.55 g of nitric acid in a nitrogen gas atmosphere at room temperature, and after following to stand the mixture in a nitrogen gas atmosphere for 2 hours, 2.5 g of polyacrylic acid was added to the mixture to carry out the hydrolysis followed by allowing to stand for 48 hours. The solution obtained was coated on the substrate with the ITO film and after spin coating under the conditions of 2,000 rpm for 40 seconds, burning was carried out at 450° C. for 20 minutes to form a porous semiconductor layer 5. In this case, the spin coating and the burning treatment were repeatedly carried out 10 times for realizing the desired film thickness.

Then, the substrate having formed thereon the porous semiconductor layer 5 was immersed in an ethanol solution of the Ru complex represented by following formula (1) (concentration of $10^{-3}$ mol/liter) to carry out an adsorption treatment with a sensitizing dye 9.

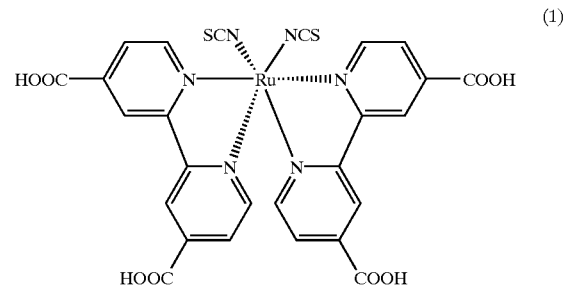

(1)

Furthermore, $CuInSe_2$ made of the elements of groups I, III, and VI was deposited thereon as a compound semiconductor layer 6 by an electrolytic deposition.

The aqueous solution used for the electrodeposition was prepared by dissolving cuprous sulfate, indium sulfate, and selenium hydroacid in water to that the concentrations of them became 30 mmols/liter, 15 mmols/liter, and 400 mmols/liter, respectively, and controlling the hydrogen ion concentration to 1.8 with citric acid.

Using a platinum (Pt) electrode as a counter electrode, an Ag/AgCl electrode as a reference electrode, and the substrate having formed thereon the porous semiconductor layer 5 as a working electrode, $CuInSe_2$ was a deposited under the conditions of the aqueous solution temperature of 25° C., the reference electrode voltage of −1 volt, and an injection charge amount of 3 C. (coulombs). The film thickness of the $CuInSe_2$ compound semiconductor layer 6 was 2 μm.

Finally, platinum having a very large work function was deposited on the compound semiconductor layer 6 by dc sputtering as an upper metal electrode 7 and thus a solar cell was prepared.

With regard to the solar cell prepared, the characteristics were evaluated as in Example 1.

EXAMPLE 5

As a transparent insulating substrate 1 shown in FIG. 5, a glass sheet was used and an ITO film was coated on the glass sheet as a transparent conductive film 2 at a thickness of 10 μm by rf sputtering. Furthermore, Ag was coated as a lower metal electrode 3 on the transparent conductive film 2 by dc sputtering.

Then, a dense film of $TiO_2$ was coated as a buffer layer 4 at a thickness of 0.2 μm using a Ti sol-gel solution.

The Ti sol-gel solution used was prepared by diluting 0.1 ml of titanium isopropoxide with 100 ml of absolute alcohol and adding dropwise a solution prepared by diluting 2.7 ml of 2N hydrochloric acid with 100 ml of absolute ethanol. The Ti sol-gel solution obtained was coated on the substrate with the ITO film and after spin coating under the conditions of 2000 rpm for 40 seconds, burning was carried out at 450° C. for 20 minutes to form a buffer layer 4. In this case, the spin coating and the burning treatment were repeatedly carried out twice for realizing the desired film thickness.

Then, $TiO_2$ was formed as a porous semiconductor layer 5 at a thickness of 1.0 μm by a composite sol-gel method.

The solution used for the composite sol-gel method was prepared by mixing 7 g of titanium isopropoxide, 20 ml of ethanol, 0.4 g of water, and 0.55 g of nitric acid in a nitrogen gas atmosphere at room temperature, and after following to stand the mixture in a nitrogen gas atmosphere for 2 hours, 2.5 g of polyacrylic acid was added to the mixture to carry out the hydrolysis followed by allowing to stand for 48 hours. The solution obtained was coated on the substrate having formed thereon a buffer layer 4, and after spin coating under the conditions of 2,000 rpm for 40 seconds, burning was carried out at 450° C. for 20 minutes to form a porous semiconductor layer 5. In this case, the spin coating and the burning treatment were repeatedly carried out 10 times for realizing the desired film thickness.

Then, the substrate having formed thereon the porous semiconductor layer 5 was immersed in an ethanol solution of the Ru complex represented by the formula (1) described above (concentration of $10^{-3}$ mol/liter) to carry out an adsorption treatment with a sensitizing dye 9.

Furthermore, CdTe made of the elements of groups II and VI was deposited thereon as a compound semiconductor layer 6 by an electrolytic deposition.

In this case, the aqueous solution used for the electrolytic deposition was prepared by mixing and dissolving cadmium sulfate octa-hydrate, cadmium chloride hydrate, and tellurium oxide in water so that the concentrations of them became 20 mmols/liter, 20 mmols/liter, and 10 mmols/liter, respectively, and controlling the hydrogen ion concentration to 2.0 with sulfuric acid.

By using a platinum (Pt) electrode as a counter electrode, an Ag/AgCl electrode as a reference electrode, and the substrate having formed thereon the porous semiconductor layer 5 as a working electrode, CdTe was deposited under the conditions of the aqueous solution temperature of 25° C., the reference electrode voltage of −700 mV, and the voltage applying time of 3,600 seconds. The film thickness of the CdTe compound semiconductor layer 6 formed was 2 μm.

Finally, platinum having a very large work function was deposited on the compound semiconductor layer 6 by dc sputtering as an upper metal electrode 7 and thus a solar cell was prepared.

With regard to the solar cell prepared, the characteristics were evaluated as in Example 1.

EXAMPLE 6

As in Example 5, on a transparent insulating substrate 1 shown in FIG. 5 were formed a transparent conductive film 2, a lower metal electrode 3, a buffer layer 4, a porous semiconductor layer 5, and a sensitizing dye 9.

Furthermore, $CuInS_2$ made of the elements of groups I, III, and VI was deposited thereon as a compound semiconductor layer 6 by an electrolytic deposition.

The aqueous solution used for the electrodeposition was prepared by mixing and dissolving cuprous sulfate, indium sulfate, and sodium thiosulfate in water so that the concentrations of them became 20 mmols/liter, 20 mmols/liter, and 10 mmols/liter, respectively, and controlling the hydrogen ion concentration to 1.5 with sulfuric acid.

By using a platinum (Pt) electrode as a counter electrode, an Ag/AgCl electrode as a reference electrode, and the substrate having formed thereon the porous semiconductor layer 5 as a working electrode, $CuInS_2$ was deposited under the conditions of the aqueous solution temperature of room temperature, the reference electrode voltage of −1100 mV, and the injection charge amount of 2 C. The film thickness of the $CuInS_2$ compound semiconductor layer 6 formed was 2 μm.

Finally, platinum having a very large work function was deposition on the compound semiconductor layer 6 by dc sputtering as an upper metal electrode 7 and thus a solar cell was prepared.

With regard to the solar cell prepared, the characteristics were evaluated as in Example 1.

Comparative Example 1

As a transparent insulating substrate 1 shown in FIG. 6, a glass sheet was used and an ITO film was coated thereon as a transparent conductive film 2 at a thickness of 10 μm by rf sputtering. Furthermore, Ag was coated as a lower metal electrode 3 of the transparent conductive film 2 by dc sputtering.

Then, $TiO_2$ was formed thereon as dense transparent semiconductor layer 8 at a thickness of 1.0 μm with solution by a Ti sol-gel method.

The Ti sol-gel solution used was prepared by diluting 28.3 g of titanium isopropoxide with 100 ml of absolute ethanol and adding dropwise thereto a solution prepared by diluting 2.7 ml of 2N hydrochloric acid with 100 ml of absolute ethanol. The Ti sol-gel solution obtained was coated on the substrate with the ITO film, and after spin coating at 2,000 rpm for 40 seconds, burning was carried out at 450° C. for 20 minutes to form a dense transparent semiconductor layer 8. In this case, the spin coating and the burning treatment described above were repeatedly carried out 10 times for realizing a desired film thickness.

Furthermore, CdTe made of the elements of groups II and VI was deposited thereon as a compound semiconductor layer 6 by an electrolytic deposition.

In this case, the aqueous solution used for the electrodeposition was prepared by mixing and dissolving cadmium sulfate octa-hydrate, cadmium chloride hydrate, and tellurium oxide in water so that the concentrations of them became 30 mmols/liter, 15 mmols/liter, and 400 mmols/liter, respectively, and controlling the hydrogen ion concentration to 2.0 with sulfuric acid.

By using a platinum (Pt) electrode as a counter electrode, an Ag/AgCl electrode as a reference electrode, and the substrate having formed thereon the dense transparent semiconductor layer 8 as a working electrode, CdTe was accumulated under the conditions of the reference electrode voltage of 20 mV and the aqueous solution temperature of 90° C. The film thickness of the CdTe compound semiconductor layer 6 formed was 2 μm.

Finally, platinum was deposited on the compound semiconductor layer 6 by dc sputtering to form an upper metal electrode 7 and thus a solar cell was prepared.

With regard to the solar cell prepared, the characteristics were evaluated as in Example 1.

Comparative Example 2

As in Example 5, on a transparent insulating substrate 1 shown in FIG. 7 were formed a transparent conductive film 2, a lower metal electrode 3, a buffer layer 4, a porous semiconductor layer 5, and a sensitizing dye 9.

After laminating the substrate having formed thereon the porous semiconductor layer 5 and an ITO glass 1 having formed thereon a thin layer of platinum 11A as a counter electrode, the end surfaces were sealed with an epoxy adhesive leaving a part of open portions, an electrolyte was permeated between both the sheets utilizing a capillary phenomenon to form a non-aqueous electrolyte layer 10, and thus, a solar cell was prepared.

As the electrolyte, a solution obtained by dissolving 1.44 g of tetrapropyl iodide and 0.076 g of iodine in 10 ml of a mixed solution of ethylene carbonate and acetonitrile (4:1 by volume ratio) was used.

With regard to the solar cell prepared, the characteristics were evaluated as in Example 1.

The evaluation results of Examples 1 to 6 and Comparative Examples 1 and 2 are shown in Table 1 below.

TABLE 1

|  | Release voltage (V) | Short-circuit current (mA/cm$^2$) | Fill factor | Conversion efficiency (%) |
|---|---|---|---|---|
| Example 1 | 0.70 | 20.2 | 0.60 | 7.50 |
| Example 2 | 0.65 | 17.0 | 0.65 | 5.40 |
| Example 3 | 0.65 | 32.2 | 0.70 | 9.90 |
| Example 4 | 0.64 | 16.0 | 0.66 | 6.76 |
| Example 5 | 0.65 | 16.8 | 0.65 | 7.09 |
| Example 6 | 0.70 | 15.6 | 0.65 | 6.98 |
| Comparative Example 1 | 0.60 | 12.1 | 0.55 | 5.02 |
| Comparative Example 2 | 0.63 | 14.2 | 0.60 | 5.37 |

From the results shown in Table 1, in the solar cells of the invention of Examples 1 to 6, the improvements of the characteristics were confirmed as compared with the solar cells of prior art (Comparative Examples 1 and 2). That is, the reasons of the improvements of the release voltage and the fill factor are considered to be that in each example, in the pn junction formed by the porous semiconductor layer and the compound semiconductor layer, the Fermi level difference was optimized as compared with the pn junction formed by the dense transparent semiconductor layer and the compound semiconductor layer of Comparative Example 1. Also, the reason of the improvement of the short-circuit electric current is considered to be that because the porous semiconductor layer was used for forming the junction, the effective junction area was increased, whereby the absolute amount of electrons capable of passing through the junction was increased and the carriers formed by the light absorption by the compound semiconductor layer could be effectively produced.

Also, because the solar cell of Comparative Example 2 had the porous semiconductor layer but did not have a compound semiconductor layer thereon, and the non-aqueous electrolyte layer on the porous semiconductor layer had the same electric resistance by an ion pass length, the impedance of the solar cell became higher than those of the solar cells of the examples, but in the solar cells in the examples, by using the compound semiconductor, the impedance could be lowered.

EXAMPLE 7

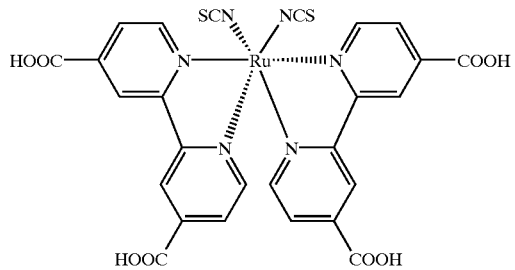

Figure 8:
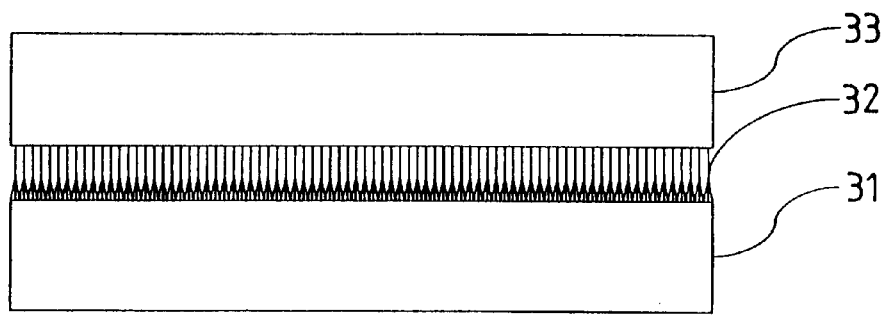
FIG. 8 is a cross-sectional view of the photoelectric conversion element of Example 7.

A single crystal TiO$_2$ substrate 31 was used as a 1st inorganic semiconductor layer substrate 31 shown in FIG. 8 and a sensitizing dye layer was formed on the surface of the single crystal TiO$_2$ substrate as an organic monomolecular layer 32. The sensitizing dye layer was formed by immersing the single crystal TiO$_2$ substrate in an ethanol solution (concentration 10$^{-3}$ mol/liter) of the Ru complex shown by the formula (1) described above and subjected to a dye adsorption treatment. Then, CuInS$_2$ made of the elements of groups I, III, and VI was deposited on the upper portion of the organic monomolecular layer 32 as a 2nd inorganic semiconductor layer 33 by electrodeposition. The aqueous solution used for the electrodeposition was prepared by dissolving cuprous sulfate, indium sulfate, and thio urea in water so that the concentrations of them became 30 mmols/liter, 15 mmols/liter, and 125 mmols/liter, respectively, and controlling the hydrogen ion concentration to 1.8 with sulfuric acid. Using platinum (Pt) as a counter electrode, an Ag/AgCl electrode as a reference electrode, and the single crystal TiO$_2$ substrate having formed thereon the organic monomolecular layer 32 as a working electrode, CuInS$_2$ was accumulated under the conditions of the reference electrode voltage of −1 volt, the aqueous solution temperature of 25° C., and the injecting charge amount of 3 C. (Coulombs). Thereafter, the sample having accumulated thereon CuInS$_2$ was dried in the air at 50° C.

As the measurement results by XRD (X-ray diffractometer), it could be confirmed that the layer formed by the above-described electrodeposition was the CuInS$_2$ and the desired materials were deposited. The film thickness of the CuInS$_2$ deposited in this case was about 2 μm. Finally, platinum having a very large work function was deposited on CuInS$_2$ by press-adhering to form an upper metal electrode (not shown). The photoelectric conversion element of the invention was prepared by the method as described above.

Figure 11:
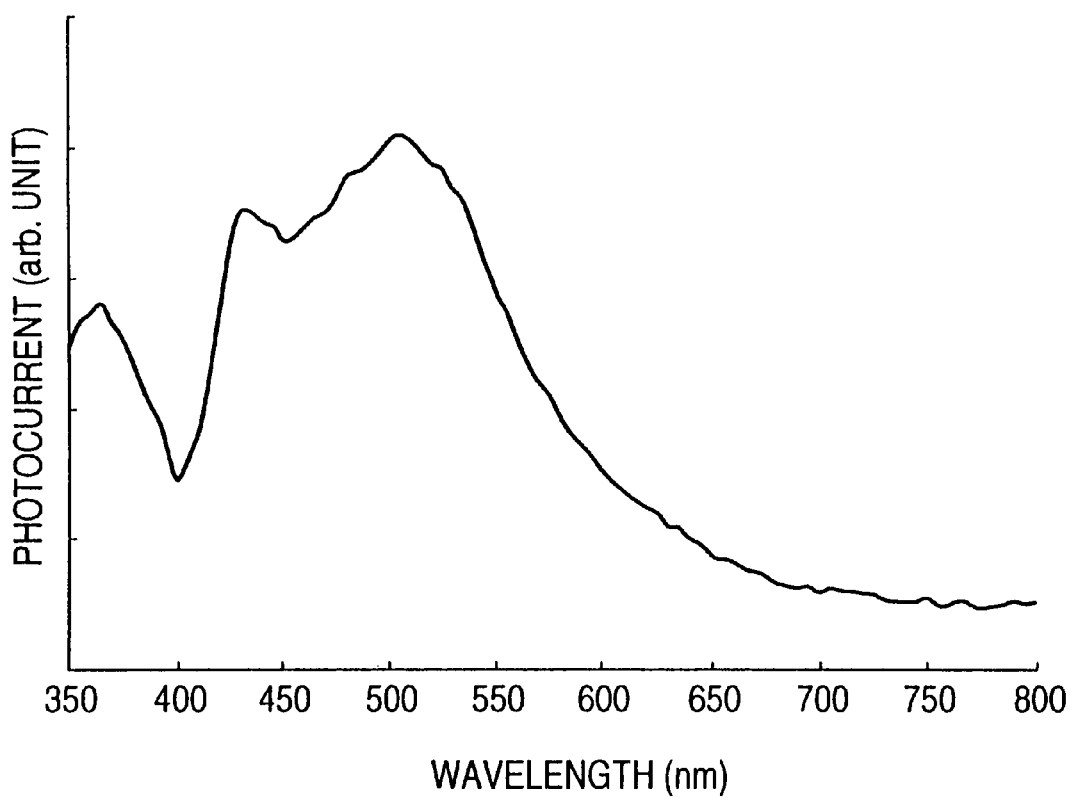
FIG. 11 is a photoelectric current spectrum of the photoelectric conversion element of Example 7 in the semiconductor device of the invention.

While irradiating the photoelectric conversion element shown in FIG. 8 prepared by the above method with a monochromatic light having a light intensity of 1 mW/cm$^2$ every specific wavelength, each electric current (photoelectric current) generated in the element by the monochromatic light was measured and the measurement results are shown in FIG. 11. From the results thereof, it was seen that the same wavelength sensitivity characteristics as the carried sensitizing dye appeared and by the sensitization of the sensitizing dye monomolecular layer by the light, an electric current was generated. Thereby, it was seen that by the electron positive hole generated by the light, the photoelectric conversion element operated based on the principle described above.

EXAMPLE 8

Figure 9:
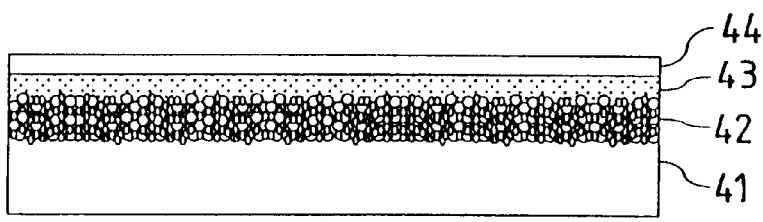
FIG. 9 is a cross-section of the solar cell of Example 8.

A single crystal TiO$_2$ substrate was used as a 1st inorganic semiconductor layer substrate 41 shown in FIG. 9, and porous $TiO_2$ was formed on the single crystal $TiO_2$ substrate at a thickness of about 0.2 μm by a composite gelling method as an inorganic porous semiconductor layer 42. The solution used in the composite gelling method for forming the porous $TiO_2$ layer was prepared by mixing 7 g of titanium isopropoxide, 20 ml of ethanol, 0.4 g of water, and 0.55 g of nitric acid at room temperature in a nitrogen gas atmosphere, and after allowing to stand the mixture in a nitrogen gas atmosphere for 2 hours, adding thereto 2.5 g of polyacrylic acid to cause the hydrolysis (add water 20 g) followed by allowing to stand for 48 hours. The porous $TiO_2$ layer was formed by coating the above-described solution on the single crystal $TiO_2$ substrate by spin coating under the conditions of 2,000 rpm for 40 seconds and carrying out burning at 450° C. for 20 minutes. In this case, the spin coating and the burning treatment were repeatedly carried out twice for realizing the above-described desired film thickness. Then, the Ru complex shown by the formula (1) described above and a proper amount of polymethyl methacrylate was mixed with a methanol solution to prepare a dispersion on the porous $TiO_2$ layer. An organic substance layer 43 was prepared by spin coating the dispersion under the conditions of 2,000 rpm for 40 seconds and drying in the air at 50° C.

Then, $CuInS_2$ made of the elements of groups I, III, and IV was deposited on the organic substance layer 43 as a second inorganic compound semiconductor 44 by an electrodeposition. The aqueous solution used for the electrodeposition was prepared by dissolving cuprous sulfate, indium sulfate, and thiourea in water so that the concentrations of them became 30 mmols/liter, 15 mmols/liter, and 125 mmols/liter respectively and controlling the hydrogen ion concentration to 1.8 with sulfuric acid. By using a platinum (Pt) electrode as a counter electrode, an Ag/AgCl electrode as a reference electrode, and the single crystal $TiO_2$ substrate having carried thereon the organic substance layer 43 and the porous $TiO_2$ layer as a working electrode, $CuInS_2$ was deposited under the conditions of the reference electrode voltage of −1 volt, the aqueous solution temperature of 25° C., and the injecting charge amount of 3 C. (Coulombs). Later, the sample having deposited thereon $CuInS_2$ was dried in the air at 50° C. From the measurement results by XRD (X-ray diffractometer), it could be confirmed that the layer formed by the above-described electrolytic deposition was the $CuInS_2$ and the desired materials were deposited. The film thickness of the $CuInS_2$ layer was about 2 μm. Finally, platinum having a very large work function was deposited on the $CuInS_2$ layer by press-adhering to form an upper metal electrode (not shown).

By the method as described above, the solar cell of the invention was prepared. While irradiating the solar cell element with a pseudo sunlight of a light intensity of 100 $mW/cm^2$, a short-circuit electric current (photoelectromotive current) passing between the photoelectrode and the counter electrode was measured. As the result thereof, it became clear that the conversion efficiency was 3.33% and the element functioned as a good solar cell.

EXAMPLE 9

Figure 10:
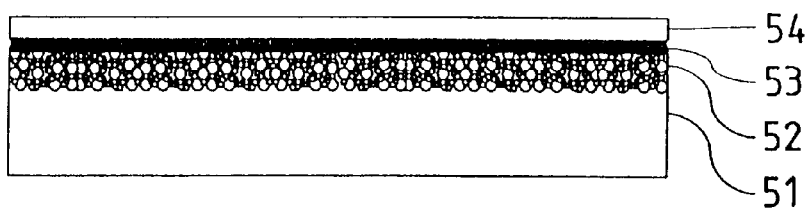
FIG. 10 is a cross-sectional view of the solar cell of Example 9.

A single crystal $TiO_2$ substrate was used as a 1st inorganic semiconductor layer 51 shown in FIG. 10, and a porous $TiO_2$ layer was formed on the single crystal $TiO_2$ substrate at a thickness of about 0.2 μm by a composite gelling method as an inorganic porous semiconductor layer 52. The solution used in the composite gelling method for forming the porous $TiO_2$ layer was prepared by mixing 7 g of titanium isopropoxide, 20 ml of ethanol, 0.4 g of water, and 0.55 g of nitric acid at room temperature in a nitrogen gas atmosphere, and after allowing to stand the mixture in a nitrogen gas atmosphere for 2 hours, adding thereto 2.5 g of polyacrylic acid to cause the hydrolysis (add water 20 g) followed by allowing to stand for 48 hours. The porous $TiO_2$ layer was formed by coating the above-described solution on the single crystal $TiO_2$ substrate by spin coating under the conditions of 2,000 rpm for 40 seconds and carrying out burning at 450° C. for 20 minutes. In this case, the spin coating and the burning treatment were repeatedly carried out twice for realizing the above-described desired film thickness. A sensitizing dye layer was formed thereon as an organic monomolecular layer 53. The sensitizing dye layer was formed by immersing the single crystal $TiO_2$ having formed thereon the porous $TiO_2$ layer in an ethanol solution of the Ru complex shown by the formula (1) described above (concentration $10^{-3}$ mol/liter) to carry out a dye adsorption treatment.

Then, $CuInS_2$ made of the elements of groups I, III, and VI was carried out on the organic substance layer 53 as a 2nd inorganic semiconductor layer 54 by an electrodeposition. The aqueous solution used for the electrodeposition was prepared by dissolving cuprous sulfate, indium sulfate, and thiourea in water so that the concentrations of them became 30 mmols/liter, 15 mmols/liter, and 125 mmols/liter respectively and controlling the hydrogen ion concentration to 1.8 with sulfuric acid. By using a platinum (Pt) electrode as a counter electrode, an Ag/AgCl electrode as a reference electrode, and the single crystal $TiO_2$ substrate having carried thereon the organic monomolecular layer 53 and the porous $TiO_2$ layer as a working electrode, $CuInS_2$ was deposited under the conditions of the reference electrode voltage of −1 volt, the aqueous solution temperature of 25° C., and the injecting charge amount of 5 C. (Coulombs). Later, the layer having deposited thereon $CuInS_2$ was dried in the air at 50° C. From the measurement results by XRD (X-ray diffractometer), it could be confirmed that the layer formed by the above-described electrolytic deposition was the $CuInS_2$ and the desired materials were deposited. The film thickness of the $CuInS_2$ layer was about 2 μm. Finally, platinum having a very large work function was deposited on the $CuInS_2$ layer by press-adhering to form an upper metal electrode (not shown). Also, an indium metal was formed by welding as a lower electrode.

By the method as described above, the solar cell of the invention was prepared. While irradiating the solar cell element with a pseudo sunlight of the light intensity of 100 $mW/cm^2$, a short-circuit electric current (photoelectromotive current) passing between the photoelectrode and the counter electrode was measured. As the result thereof, it became clear that the conversion efficiency was 4.62% and the element functioned as a good solar cell.

Comparative Example 3

By the same procedure as in Example 9, a porous $TiO_2$ layer and the sensitizing dye layer were formed on a single crystal $TiO_2$ substrate. Furthermore, at the porous $TiO_2$ layer side of the single crystal $TiO_2$ substrate having formed thereon the porous $TiO_2$ layer carrying the sensitizing dye layer and at the Pt side of a counter electrode carrying Pt on a glass substrate by dc sputtering was formed a hole transport layer by spin coating a mixture of methylene chloride as a solvent and polyferin becoming the hole transport layer so that the concentration of polyferin became 5% by weight under the conditions of 2000 rpm for 40 seconds. Both substrates were laminated with the hole transport layers facing each other and they were welded by a vacuum treatment to prepare a polyferin/sensitizing dye/porous titanium oxide/single crystal titanium structure.

While irradiating the solar cell element with a pseudo sunlight of the light intensity of 100 mW/cm$^2$, a short-circuit electric current (photoelectromotive current) passing between the photoelectrode and the counter electrode was measured. As a result, it was found that the conversion efficiency became a very low value and the product functioned as a solar sell but it was very inferior to the solar cells of the invention from the viewpoint of the performance.

In addition, for comparison, the results of Examples 8 and 9 and Comparative Example 3 are shown in Table 2.

TABLE 2

| Characteristics | Example 8 | Example 9 | Comparative Example 3 |
|---|---|---|---|
| Release voltage (V) | 0.46 | 0.5 | 0.13 |
| Short-circuit current (mA/cm$^2$) | 12.1 | 16.8 | $2.09 \times 10^{-5}$ |
| Fill factor | 0.6 | 0.55 | 0.52 |
| Conversion efficiency (%) | 3.33 | 4.62 | $2.08 \times 10^{-6}$ |

As described above, according to the semiconductor device of the invention, a solar cell excellent in the energy conversion efficiency can be provided.

Also, according to the production method of semiconductor device of the invention, for the preparation of a porous semiconductor layer and a compound semiconductor layer, a composite gelling method, an electrolytic deposition, a chemical bath deposition, and a photochemical deposition can be used, whereby a solar cell capable of reducing the production cost, saving energy, and increasing the area can be provided without using an expensive apparatus and without a restriction of the preparation area by an apparatus scale.

What is claimed is:

1. A semiconductor device comprising:
   a porous semiconductor layer,
   an inorganic semiconductor layer formed thereon, and
   an organic substance layer formed between the porous semiconductor layer and the inorganic semiconductor layer,
   wherein the organic substance is adsorbed onto the porous semiconductor layer, and
   wherein the porous semiconductor is an N-type semiconductor or a P-type semiconductor, and the inorganic semiconductor is the other type of semiconductor.

2. The semiconductor device according to claim 1 wherein the porous semiconductor layer contains a metal oxide.

3. The semiconductor device according to claim 1 wherein the inorganic semiconductor layer contains a compound semiconductor.

4. The semiconductor device according to claim 1 wherein the semiconductor device is used as a solar cell.

5. The semiconductor device according to claim 1, wherein the organic substance layer is a monomolecular layer.

6. The semiconductor device according to claim 1, wherein the organic substance layer comprises a sensitizing dye.

7. The semiconductor device according to claim 1, wherein the inorganic semiconductor layer contains a compound semiconductor.

8. The semiconductor device according to claim 7 wherein the compound semiconductor comprises indium copper sulfide.

9. The semiconductor device according to claim 1, wherein the porous semiconductor comprises titanium oxide.

10. The semiconductor device according to claim 1, wherein the semiconductor device is used as a solar cell.

11. A method of producing the semiconductor device of claim 1, which comprises immersing a porous semiconductor layer or a semiconductor layer having an organic substance layer thereon in a solution containing elements constituting an inorganic semiconductor or compounds containing the constituting elements, and forming an inorganic semiconductor layer onto the porous semiconductor layer or the organic substance layer in the solution.

12. A semiconductor device comprising two inorganic semiconductor layers and an organic monomolecular layer formed therebetween, wherein one of the two inorganic semiconductors is an N-type semiconductor and the other inorganic semiconductor is a P-type semiconductor and wherein the organic monomolecular layer is adsorbed onto one of the two inorganic semiconductors.

13. The semiconductor device according to claim 12 wherein the semiconductor device is used as a solar cell.

14. A method of producing the semiconductor device of claim 12, which comprises immersing a porous semiconductor layer or a semiconductor layer having an organic substance layer thereon in a solution containing elements constituting an inorganic semiconductor or compounds containing the constituting elements, and forming an inorganic semiconductor layer onto the porous semiconductor layer or the organic substance layer in the solution.

* * * * *